US006471830B1

(12) United States Patent
Moslehi et al.

(10) Patent No.: US 6,471,830 B1
(45) Date of Patent: Oct. 29, 2002

(54) INDUCTIVELY-COUPLED-PLASMA IONIZED PHYSICAL-VAPOR DEPOSITION APPARATUS, METHOD AND SYSTEM

(75) Inventors: Mehrdad M. Moslehi, Los Altos, CA (US); Ajit P. Paranjpe, Sunnyvale, CA (US)

(73) Assignee: Veeco/CVC, Inc., Plainview, NY (US)

( * ) Notice: Subject to any disclaimer, the term of this patent is extended or adjusted under 35 U.S.C. 154(b) by 0 days.

(21) Appl. No.: 09/678,267

(22) Filed: Oct. 3, 2000

(51) Int. Cl.$^7$ .............................................. C23C 14/34
(52) U.S. Cl. ........................... 204/192.12; 204/298.06; 204/298.08; 204/298.11; 204/298.12; 204/298.15
(58) Field of Search ................... 204/192.12, 298.06, 204/298.08, 298.12, 298.11, 298.15

(56) References Cited

U.S. PATENT DOCUMENTS

| | | | |
|---|---|---|---|
| 4,169,031 A | 9/1979 | Brors | 204/192 R |
| 4,444,643 A | 4/1984 | Garrett | 204/298 |
| 4,631,106 A | 12/1986 | Nakazato et al. | 156/345 |
| 4,796,562 A | 1/1989 | Brors et al. | 118/725 |
| 4,891,499 A | 1/1990 | Moslehi | 219/502 |
| 4,902,394 A | 2/1990 | Kenmotsu et al. | 204/192.12 |
| 4,956,538 A | 9/1990 | Moslehi | 219/121.6 |
| 5,079,481 A | 1/1992 | Moslehi | 315/111.41 |
| 5,082,542 A | 1/1992 | Moslehi et al. | 204/192.32 |
| 5,156,461 A | 10/1992 | Moslehi et al. | 374/121 |
| 5,231,334 A | * 7/1993 | Paranjpe | 315/111.41 |
| 5,252,178 A | 10/1993 | Moslehi | 156/643 |
| 5,255,286 A | 10/1993 | Moslehi et al. | 374/121 |
| 5,268,989 A | 12/1993 | Moslehi et al. | 392/418 |
| 5,317,656 A | 5/1994 | Moslehi et al. | 385/12 |
| 5,354,443 A | 10/1994 | Moslehi | 204/192.12 |
| 5,367,606 A | 11/1994 | Moslehi et al. | 392/418 |
| 5,397,962 A | 3/1995 | Moslehi | 315/111.51 |
| 5,429,070 A | 7/1995 | Campbell et al. | 118/723 R |
| 5,431,799 A | 7/1995 | Mosely et al. | 204/298.06 |
| 5,436,172 A | 7/1995 | Moslehi | 437/8 |
| 5,443,315 A | 8/1995 | Lee et al. | 374/126 |

(List continued on next page.)

FOREIGN PATENT DOCUMENTS

| | | | | |
|---|---|---|---|---|
| EP | 0 690 666 A1 | 3/1996 | | H05H/1/46 |
| WO | 97/08734 | 3/1997 | | H01J/37/32 |
| WO | WO-98/01893 A1 | * 1/1998 | | |

OTHER PUBLICATIONS

Sellers, "Asymmetric Bipolar Pulsed DC, The Enabling Technology for Reactive PVD", ENI Tech–Note, pp. 1–7, 1996.
Sellers, "Using the RPG Generator", ENI, pp. 1–4, 1996.

Primary Examiner—Patrick Ryan
Assistant Examiner—Gregg Cantelmo
(74) Attorney, Agent, or Firm—Gray, Cary, Ware & Freidenrich

(57) ABSTRACT

A system and related method are disclosed for performing an inductively-coupled-plasma ionized physical-vapor deposition ("PVD") process for depositing material layers onto a substrate. Within a PVD process chamber are contained a target/cathode assembly, a chuck assembly, a process medium, a variable height inductively-coupled ("VHIC") ionization coil segment and an antenna actuator for controlling the relative vertical position of the variable height inductively-coupled ionization coil segment. The VHIC coil segment can be contained within a dielectric liner and can be covered by a multi-slotted grounded electrostatic shield. The VHIC ionization coil segment can comprise one or more zones comprised of one or more coil loops powered by one or more radio-frequency power supplies. Each zone can be powered through an adjustable passive electrical component for providing multiple inductive zone operations during a deposition process.

65 Claims, 17 Drawing Sheets

U.S. PATENT DOCUMENTS

| | | | |
|---|---|---|---|
| 5,444,815 A | 8/1995 | Lee et al. | 392/416 |
| 5,446,825 A | 8/1995 | Moslehi et al. | 392/416 |
| 5,453,124 A | 9/1995 | Moslehi et al. | 118/715 |
| 5,464,476 A | 11/1995 | Gibb et al. | 118/723 MP |
| 5,464,499 A | 11/1995 | Moslehi et al. | 216/71 |
| 5,467,220 A | 11/1995 | Xu | 359/350 |
| 5,567,268 A | 10/1996 | Kadomura | 156/345 |
| 5,591,493 A | 1/1997 | Paranjpe et al. | 427/569 |
| 5,683,548 A | 11/1997 | Hartig et al. | 156/643.1 |
| 5,716,451 A | 2/1998 | Hama et al. | 118/723 |
| 5,746,897 A | 5/1998 | Heimanson et al. | 204/298.2 |
| 5,795,429 A | 8/1998 | Ishii et al. | 156/345 |
| 5,800,618 A | 9/1998 | Niori et al. | 118/723 E |
| 5,800,619 A | 9/1998 | Holland et al. | 118/723 I |
| 5,800,688 A * | 9/1998 | Lantsman et al. | 204/298.11 |
| 5,804,042 A * | 9/1998 | Ferreira et al. | 204/192.12 |
| 5,810,982 A | 9/1998 | Sellers | 204/298.08 |
| 5,846,883 A | 12/1998 | Moslehi | 438/711 |
| 5,858,471 A | 1/1999 | Ray et al. | 427/524 |
| 5,876,573 A | 3/1999 | Moslehi et al. | 204/192.12 |
| 5,925,227 A * | 7/1999 | Kobayashi et al. | 204/298.25 |
| 5,948,215 A * | 9/1999 | Lantsman | 204/192.12 |
| 5,976,261 A | 11/1999 | Moslehi et al. | 118/719 |
| 6,051,113 A | 4/2000 | Moslehi | 204/192.12 |
| 6,080,285 A * | 6/2000 | Liu et al. | 204/192.12 |
| 6,117,279 A * | 9/2000 | Smolanoff et al. | 204/192.12 |
| 6,210,539 B1 * | 4/2001 | Tanaka et al. | 204/298.06 |
| 6,221,217 B1 | 4/2001 | Moslehi et al. | 204/192.12 |

* cited by examiner

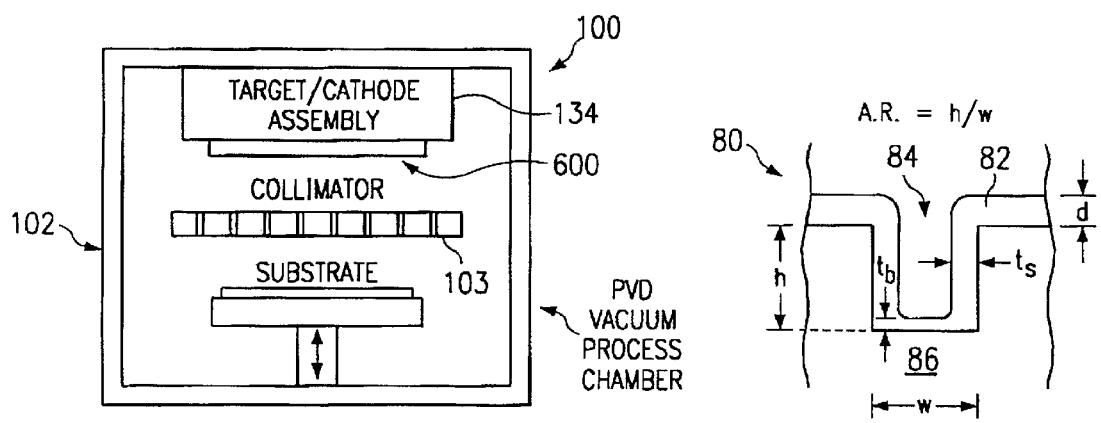
FIG. 1a
(PRIOR ART)
FIG. 3
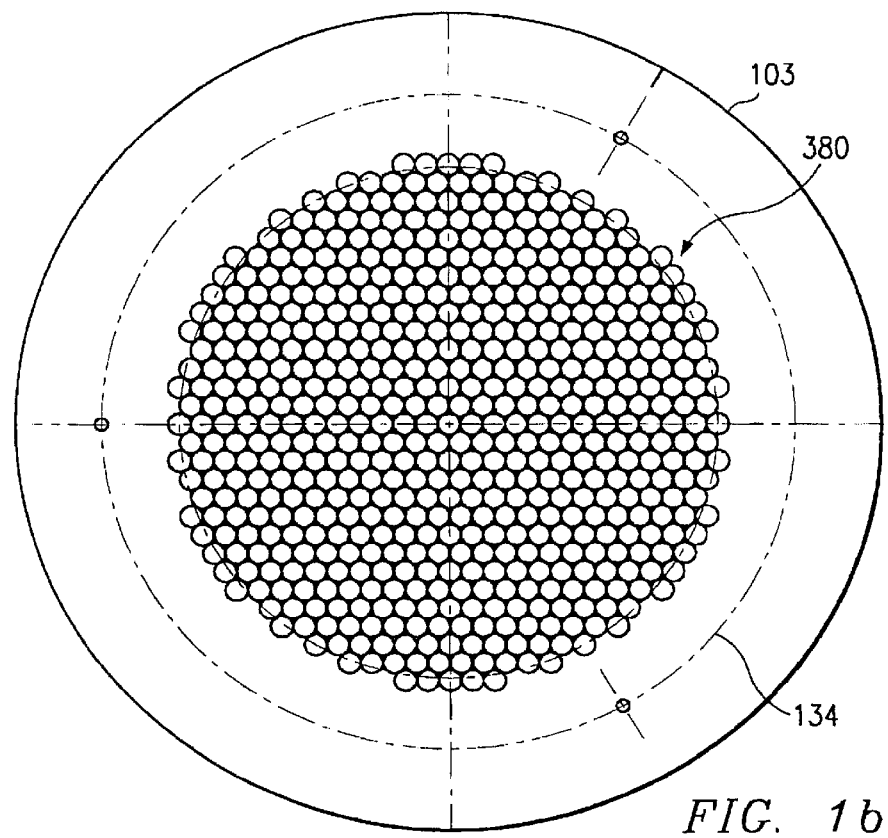
FIG. 1b

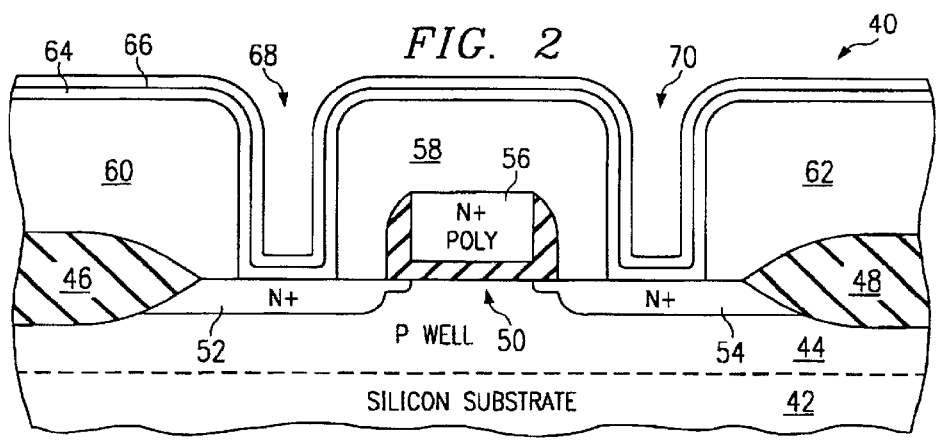
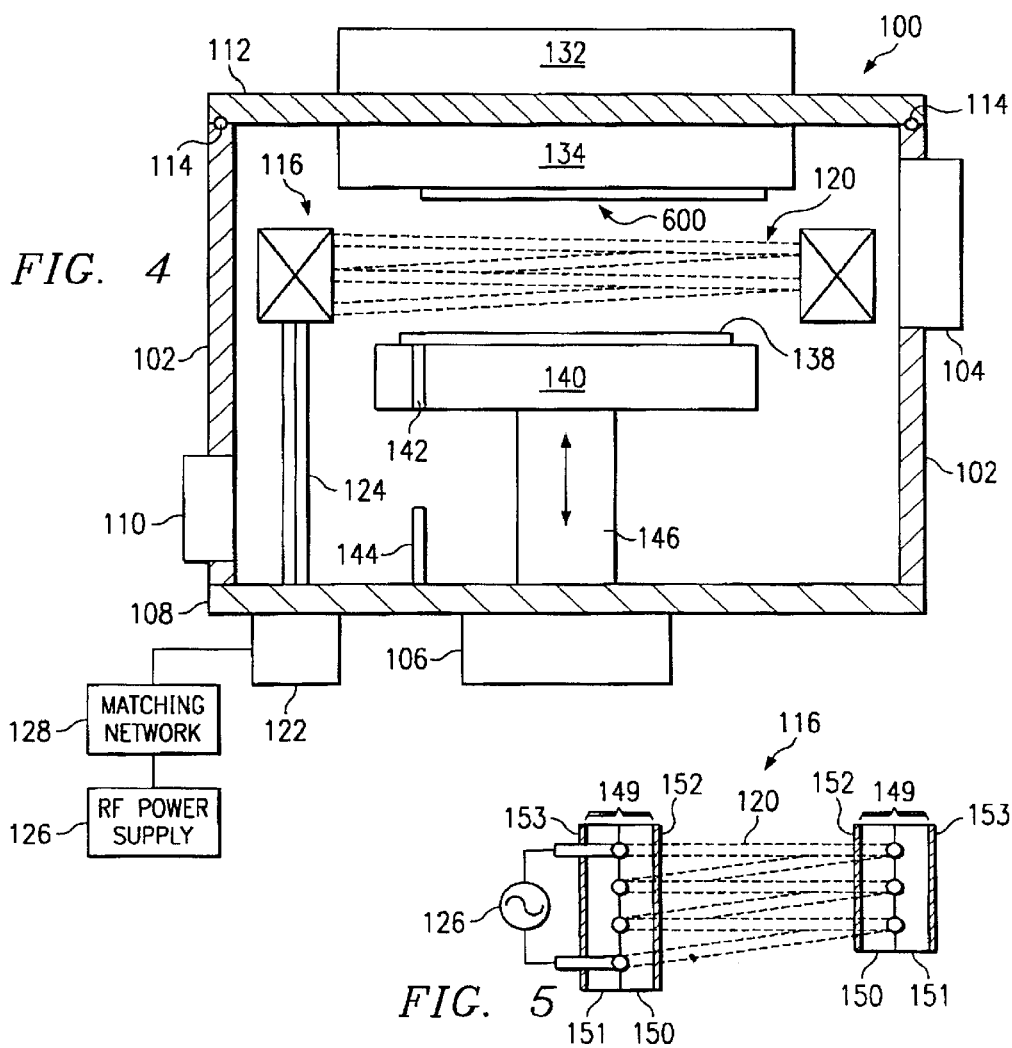

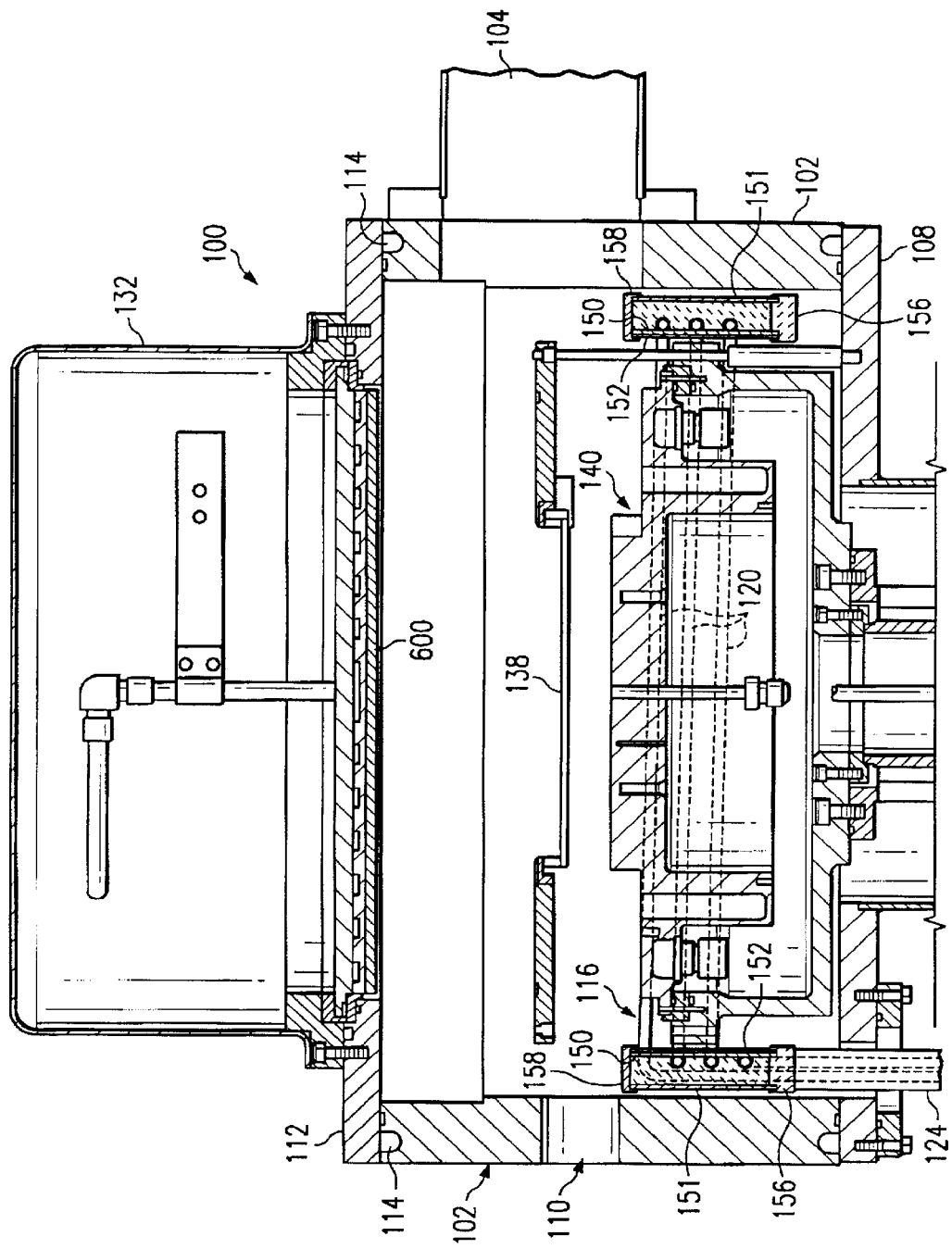

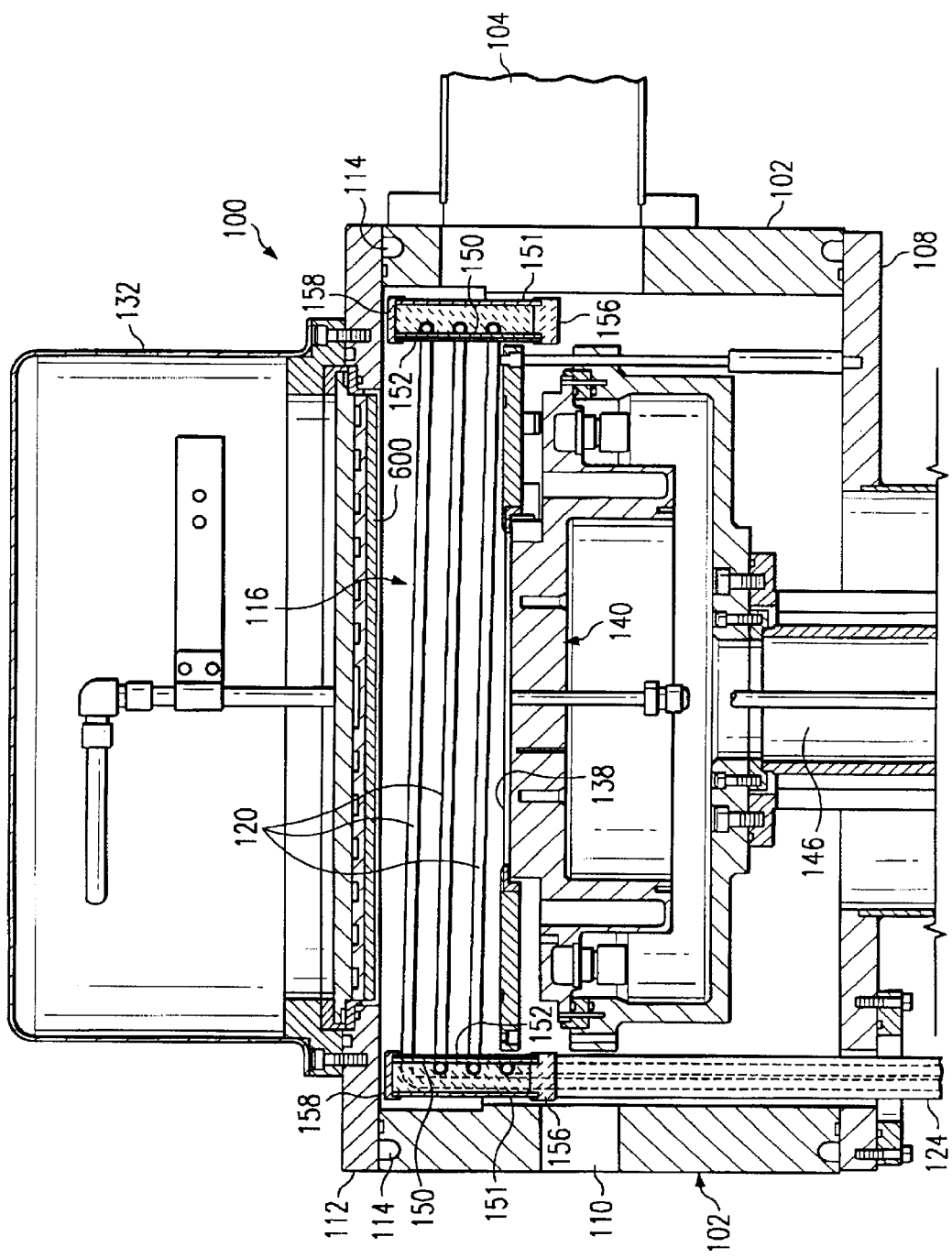

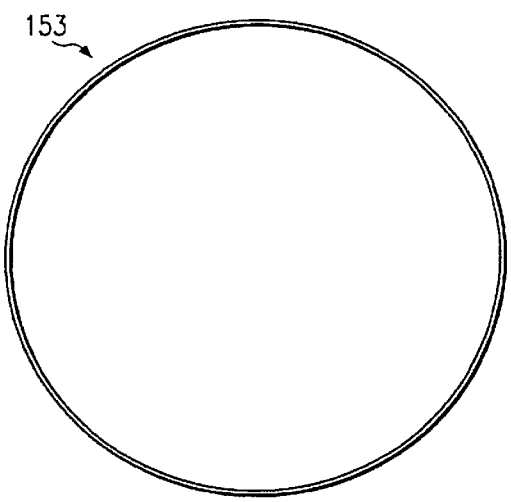
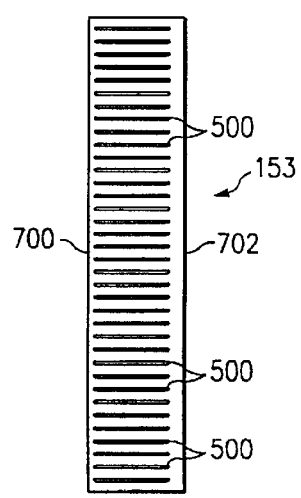
FIG. 10A    FIG. 10B
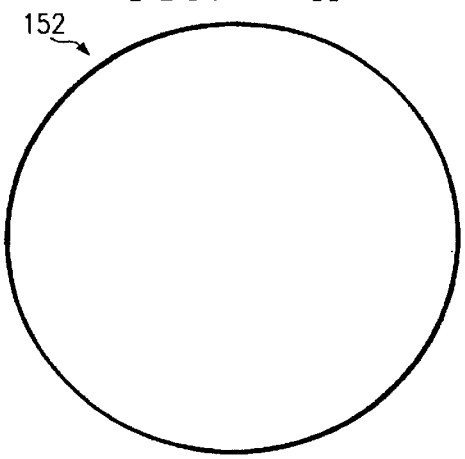
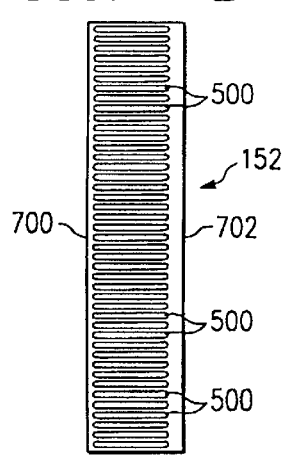
FIG. 11A    FIG. 11B
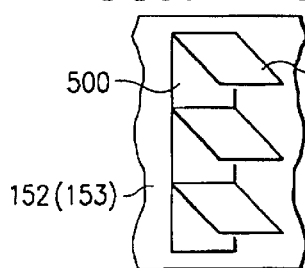
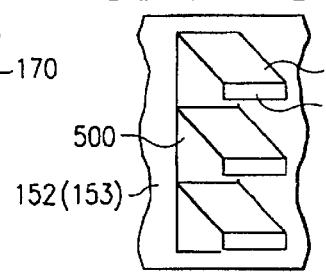
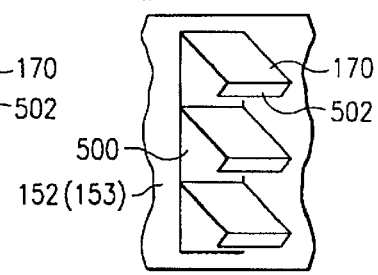
FIG. 11C    FIG. 11D    FIG. 11E
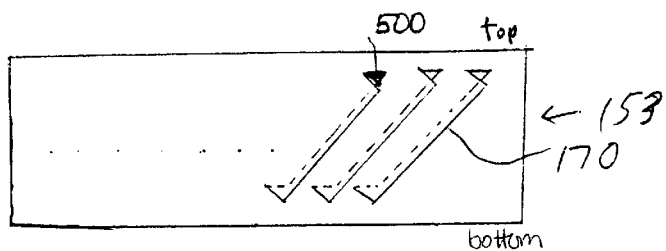
FIG. 11F

INDUCTIVELY-COUPLED-PLASMA IONIZED PHYSICAL-VAPOR DEPOSITION APPARATUS, METHOD AND SYSTEM

TECHNICAL FIELD OF THE INVENTION

The present invention relates to a system and method for plasma-assisted processing of microelectronic devices, and, more particularly, to a method, apparatus, and system for performing high-performance inductively-coupled plasma ionized physical-vapor deposition of thin films, such as those which are widely used in manufacturing of semiconductor integrated circuits, data storage thin-film heads, flat-panel displays, photovoltaic devices, and other devices used in electronics and information systems. Applications of particular interest include integrated circuit metallization as well as collimated deposition of thin films for fabrication of thin-film heads.

BACKGROUND OF THE INVENTION

Plasma-assisted physical-vapor deposition (PVD) is a commonly used thin-film fabrication technology for manufacturing of semiconductor, data storage, flat-panel display, and photovoltaic devices. PVD processes are widely used in advanced metallization applications for deposition of interconnect liner/barrier layers and interconnect metal lead layers in semiconductor chips. For instance, PVD processes are utilized to deposit Ti/TiN liner/barrier layers as well as metallization materials such as Al or Cu. Plasma sputtering is the most important PVD fabrication technique.

Existing commercial PVD technologies usually employ DC or RF magnetron sputtering in vacuum chambers. Typical commercial PVD equipment includes a single-substrate (single-wafer) vacuum process chamber (preferably designed as a cluster tool module), a temperature-controlled chuck (with the option to apply electrical bias power to the chuck) to hold the substrate, and a sputter target (or magnetron cathode) that contains the desired material. DC magnetron plasma excitation (with DC power levels up to 10 kW to 20 kW) is usually used for sputter deposition of electrically conductive materials such as Al, Ti, Co, and TiN. RF magnetron or pulsed DC (AC) sputtering is usually used for sputter deposition of electrically insulating (or resistive) materials. RF diode sputtering (as opposed to magnetron PVD sputtering) is the preferred choice for sputter deposition of some magnetic materials and insulating materials for applications such as thin-film head fabrication.

Each of these PVD methods generates a plasma from an inert gas such as Ar or another reactive gas such as nitrogen and sustains the plasma near the target area. The target material atoms or molecules are then sputtered from the target surface and deposited on the device substrate. Sputtering of the target occurs due to the impact of energetic argon ion species. During the sputtering process, the sputtered species (mostly neutrals) are emitted within the vacuum chamber plasma environment over a wide range of spatial angles and a portion of the sputtered flux deposits on the device substrate. Other sputtering processes, such as reactive sputtering processes, use nitrogen or oxygen or another reactive gas usually mixed with an inert gas such as argon within the vacuum chamber. Reactive magnetron sputtering processes that deposit TiN layers from elemental Ti targets illustrate an example of this technique.

In general, the flux of the sputter atoms or species that the PVD target material emits has a relatively broad angular distribution. Thus, some of the sputtered flux is further scattered by the collisions with the sputtering gas atoms. The sputter flux of species arriving at the substrate surface has a relatively broad distribution angle. This broad distribution angle does not present a problem in applications involving substrates without high aspect ratio features or with relatively minor surface topography features.

However, most semiconductor device manufacturing applications involve substrates with high-aspect-ratio features. These applications require some degree of spatial filtering or collimation for the sputter species. A broad angular distribution of the PVD flux provides poor collimation or a low degree of collimation, whereas a narrow angular distribution relative to the perpendicular axis indicates a higher degree of PVD collimation. For instance, semiconductor interconnect applications require collimated sputtering for deposition of the contact and via liner/glue and barrier layers (e.g. Ti/TiN) when using high aspect ratio (for instance, on the order of $\geq 3:1$) contacts and vias due to the bottom coverage and sidewall coverage requirements. For a contact/via hole of width (or diameter) W and height H, the following parameters can be defined:

A.R. $\triangleq$ $$\frac{H}{W}$$

(aspect ratio)

Bottom Coverage $\triangleq$ $$\frac{t_b}{d}$$

Sidewall Coverage $\triangleq$ $$\frac{t_s}{d}$$

(step coverage)
where d is the thickness of sputtered material layer on extended flat top surfaces (also known as the field area), $t_b$ is the sputtered material thickness at the bottom of the hole, and $t_s$ is the thickness of the sputtered material on the hole sidewall at mid height.

In conventional PVD processes without any built-in sputtering collimation feature, the bottom coverage and sidewall coverage of the sputter deposited material degrades significantly as the microstructure aspect ratio increases. This degradation becomes increasingly and rapidly worse for microstructure aspect ratios of greater than 3:1. As a result, for applications requiring good bottom coverage (e.g., $\geq 25\%$) and sidewall coverage ($\geq 50\%$), existing PVD technologies use one or another of the various existing methods of PVD collimation. These include physical collimation, natural or long-throw collimation, hollow-cathode PVD collimation, and inductively-coupled plasma (ICP) enhanced ionized PVD collimation. For example, FIG. 1a (prior art) shows a typical physical collimation technique. A collimator plate is placed between the PVD target or cathode assembly and the substrate inside the vacuum chamber. The collimator plate, usually made of aluminum or titanium, consists of an array of circular or hexagonal (honeycomb) closely packed holes (see FIG. 1(b)) that typically have an aspect ratio of 1:1 or higher. The collimator plate operates as a spatial filter to reduce the angular distribution of the sputter flux species arriving at the substrate.

Of the existing PVD collimation methods, ICP PVD collimation may provide the greatest degree of collimation control, including real-time adjustability, the greatest deposition rate for a given degree of collimation, and the least amount of maintenance downtime to clean PVD chamber components. However, despite these advantages, existing ICP PVD collimation methods have a number of drawbacks and disadvantages.

First, existing ICP PVD processes do not allow for variable (adjustable in real time) antenna position relative to the target and substrate. As a result, variations in the target material properties and other aspects affecting process uniformity (such as ionization uniformity and ionization intensity near the wafer, which affect degree of collimation and deposition rate) cannot be compensated for by repositioning the antenna during the PVD process itself, but instead require equipment downtime to change the position of the antenna relative to the substrate and target. The need to manually reposition the antenna to improve process uniformity has a negative impact on the overall equipment uptime and product throughput, resulting in increased process expense.

Second, the ICP antenna is exposed to the PVD plasma, resulting in etching and sputtering of the antenna. The antenna must preferably therefore be made of the same material as the target since the antenna material itself will be sputtered and deposited throughout the process chamber, including on the substrate. The antenna is in essence also the target deposition material and is consumed, requiring frequent replacement. The need to replace the ICP antenna likewise negatively impacts overall equipment uptime and product throughput and results in increased cost due to replacement of antennas, and limits the materials that can be deposited unless the material can be fabricated as an antenna.

Third, current ICP PVD processes use a single-zone antenna to couple additional energy to the plasma and thereby further ionize the species atoms coming from the target. Use of a single-zone antenna does not allow real-time individualized control of the ionization and collimation in distinct areas of the process environment. Process and collimation uniformity are therefore not optimized over the entire substrate surface.

SUMMARY OF THE INVENTION

Therefore, there is a need for an ICP PVD collimation technique that provides the capability for real time adjustment of ICP PVD antenna position relative to the target and substrate.

A further need exists for an improved ICP PVD collimation technology that does not consume the ICP PVD antenna and therefore does not require the ICP PVD antenna to be made of the same material as the target.

A still further need exists for an ICP PVD technology with the capability of using a multi-zone ICP PVD antenna to allow for real-time independent control of the ionization and collimation in distinct areas of the process environment.

The present invention provides an apparatus and method for processing a substrate such as a semiconductor wafer using inductively-coupled plasma (ICP) enhanced ionized physical-vapor deposition (PVD) (particularly plasma sputtering) that substantially eliminates or reduces disadvantages and problems associated with previously developed PVD techniques for deposition of various material layers.

In particular, the present invention provides a system and method for performing an inductively-coupled plasma ionized physical-vapor deposition process for depositing a material layer onto a work piece such as a silicon substrate. The system includes a PVD process chamber within which are contained a target/cathode assembly, a chuck assembly, a process medium, an adjustable-height inductively-coupled ionization coil segment and an antenna actuator for controlling the relative vertical position of the variable-height inductively-coupled ionization coil segment. The variable-height inductively-coupled ionization coil segment can be contained within a dielectric liner and can be substantially covered by a multi-slotted electrostatic shield. The variable-height inductively-coupled ionization coil segment can be comprised of one or more coil loops electrically interconnected to form one or more zones which are powered by one or more radio-frequency power supplies through at least one adjustable passive electrical component for providing multiple inductive-zone operation during a deposition process. The chuck assembly can be an adjustable-height chuck assembly further comprised of a chuck actuator connected to the chuck assembly for controlling the relative vertical position of the chuck assembly with respect to the target/cathode.

A second embodiment of the improved PVD apparatus of this invention includes an antenna coil contained within a dielectric housing integrated into either the variable-height chuck assembly of the first embodiment or into a clamp table on the variable-height chuck assembly. Still a third embodiment of the improved PVD apparatus of this invention further comprises an inductive antenna tubing contained within a dielectric lid-lift insert between the lid and the main chamber wall of the vacuum process chamber.

The present invention provides an important technical advantage of an ICP PVD collimation technique that has the capability for real time adjustment of ICP PVD antenna position relative to the target and substrate.

Another technical advantage of the present invention is that it provides an improved ICP PVD collimation technology that does not consume the ICP PVD antenna and therefore does not require frequent replacement of the ICP PVD antenna, or that the ICP PVD antenna be made of the same material as the target.

A further technical advantage of the present invention is the capability of using a multi-zone ICP PVD antenna to allow for real-time individualized control of the ionization and collimation in distinct areas of the process environment.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIG. 1a shows a prior art collimated PVD system including a physical collimator;

FIG. 1b illustrates a physical collimator plate;

FIGS. 2 and 3 demonstrate the device topography features as well as the bottom and sidewall coverage of semiconductor devices formed using collimated ICP PVD processes;

FIG. 4 depicts an ICP PVD vacuum process chamber with a first embodiment of the improved ICP PVD apparatus of the present invention;

FIG. 5 shows an isolated view of the variable-height inductively coupled ionization coil segment and power supply of the embodiment of this invention described in FIG. 4;

FIGS. 6 and 7 show a more detailed view of an IC PVD fabrication process chamber with the first embodiment of this invention;

FIGS. 10A and 10B show the outer slotted metallic electrostatic shield of the first embodiment of this invention as described in FIG. 5;

FIGS. 11A and 11B show the inner slotted metallic electrostatic shield of the first embodiment of this invention as described in FIG. 5;

FIGS. 11C, 11D, 11E and 11F show three variations of sputter shield fins that can be incorporated into the slotted metallic electrostatic shields of this invention;

DETAILED DESCRIPTION OF THE INVENTION

Figure 8A:
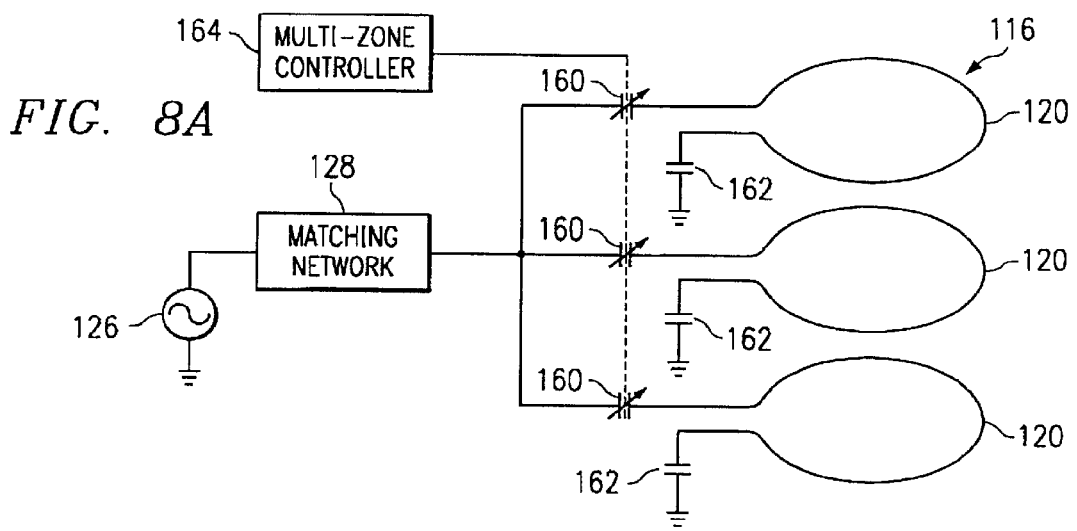
FIGS. 8A, 8B and 8C show three variations of ionization antenna power and capacitive/inductive coupling networks.

Preferred embodiments of the present invention are illustrated in the FIGUREs, like numerals being used to refer to like and corresponding parts of the various drawings.

The improved ICP PVD apparatus of the present invention provides an improved system and method for performing an inductively-coupled plasma ionized physical-vapor deposition process for depositing a material layer onto a work piece (typically a substrate or wafer) in a vacuum process chamber.

FIGS. 2 and 3 illustrate representative bottom and sidewall coverage of high-aspect-ratio features on semiconductor devices using collimated ICP PVD processes. FIG. 2 shows a cross-section of a Metal-Oxide-Semiconductor Field-Effect Transistor (MOSFET) with the. interconnect glue layer 64 and barrier layer 66 formed over the contact structure by PVD, and indicates the requirements a PVD process must meet for such application. In FIG. 2, transistor or MOSFET device structure 40 is fabricated on a silicon substrate 42. Doped P-well 44 is partially covered by device isolation field oxide layer 46 and 48. Gate dielectric region 50 is formed over the device (MOSFET) channel between the N+-doped source 52 and drain 54 junctions. N+ polysilicon gate electrode 56 is formed over the gate dielectric region 50 between the N+-doped source 52 and drain 54 junctions. An inter-level dielectric (ILD) layer is then formed over the MOSFET device structure and is subsequently patterned to form the interconnect contact holes, such as the source contact hole 68, the drain contact hole 70, and the gate contact hole (not shown) within ILD regions 58, 60, and 62. Titanium glue layer 64 covers the sidewalls and bottoms of contact holes as well as ILD regions 58, 60, and 62. Titanium nitride (TiN) or another suitable barrier 66 covers titanium glue layer 64 over the same regions. Contact hole 68 over the MOSFET source junction 52 is shown between ILD regions 58 and 60. Moreover, contact hole 70 formed over drain 54 is shown between ILD regions 58 and 62.

FIG. 3 shows in more detail the contact or via hole structure 80 for which a collimated PVD process must be used to deposit the glue and/or barrier layers. For instance, a collimated PVD process such as ionized PVD deposits layer 82 over contact/via hole 84 on substrate 86. As FIG. 3 depicts, the desired layer 82 has a top surface thickness $t_b$, with a sidewall layer thickness $t_s$ and a bottom thickness $t_B$ within the contact/via hole with a diameter (width) of w and height of h $$\left(\text{Aspect Ratio} = \frac{h}{w}\right).$$

This is a simplified schematic diagram since in practice the sidewall layer thickness varies between the top and the bottom of the sidewall (similarly, the layer thickness varies between the center and corner of the contact/via hole bottom).

In practice, the PVD processes always result in $t_s < d$ and $t_b < d$, and the thickness ratios $$\frac{t_s}{d} \text{ and } \frac{t_b}{d}$$

become smaller as the contact/via aspect ratio increases. A collimated ICP PVD process such as the ICP PVD process of this invention improves the sidewall coverage and bottom coverage by increasing the thickness ratios $$\frac{t_s}{d} \text{ and } \frac{t_b}{d}.$$

FIG. 1 (b) shows a physical collimator that the present invention can replace. Collimator 103 includes numerous cylindrical or honeycomb passageways 380 for collimating the sputtered species within process chamber 100. FIG. 1(a) shows the position of collimator 103 as it may appear within vacuum chamber sidewalls 102 of process chamber 100 and beneath target 600 of cathode/target assembly 134.

FIG. 4 is a concept drawing of a ICP PVD plasma sputtering process chamber containing an adjustable-height (controlled relative position with respect to the ICP PVD target and chuck) inductively-coupled ionization coil segment. FIG. 4 shows a side cut-away view of ICP PVD fabrication reactor process chamber 100 including an embodiment of the improved ICP PVD apparatus of the present invention. Process chamber 100 includes vacuum chamber sidewalls 102 to which vacuum pump port 104 attaches. Chuck drive 106 (used for up/down motion of the adjustable-height chuck 140) attaches to vacuum chamber base plate 108 of process chamber 100. Wafer transport valve 110 permits loading and unloading of substrate 138 between process chamber 100 and a central wafer handling chamber. Vacuum top lid 112 seals process chamber 100 through O-ring seal 114 to vacuum chamber sidewalls 102.

FIG. 4 shows variable-height inductively-coupled ("VHIC") ionization coil segment 116 for ICP PVD according to the first embodiment of this invention. VHIC ionization coil segment 116 can be comprised of one or more individual electrically interconnected loop-shaped segments coil loops 120 for providing enhanced ionization of a sputtered species from target 600 of cathode/target assembly 134. Alternatively, VHIC ionization coil segment 116 can be a single continuous coil segment shaped (coiled) into one or more coil loops 120. VHIC ionization coil segment 116 can be constructed as a single-zone or multi-zone inductive-coupling FVD antenna, each zone being comprised of one or more coil loops 120. Antenna drive 122 attaches to vacuum base plate 108 of process chamber 100. Up/down actuation mechanism and RF feedthrough 124 penetrates through vacuum base plate 108 of process chamber 100 and associates with antenna drive 122 (together they adjust, in real time, the vertical position of VHIC ionization coil segment 116 relative to substrate 138).

When configured as a single-zone antenna, VHIC ionization coil segment 116 can be powered by at least one RF power supply 126 through matching network 128. When constructed as a multi-zone inductive coupling antenna, VHIC ionization coil segment 116 can be powered by either single or multiple RF power supplies 126 in conjunction with single or multiple matching networks 128 (comprised of power partitioning/rationing capacitors/inductors) for multi-zone power adjustment and process uniformity control. In DC magnetron PVD equipment, rotating magnet array assembly 132 associates with vacuum top lid 112 above cathode/target assembly 134. In non-magnetron PVD applications such as RF diode PVD, magnet assembly 132 is not used. The distance between target 600 and substrate 138 is variable and can be controlled by up/down actuation mechanism 146 of adjustable-height chuck 140.

Cathode/target assembly 134 comprises a target 600 and the provisions for electrical powering of target 600. Substrate 138 (the work piece) rests upon adjustable-height chuck 140, which may also provide temperature regulation and control capability and the capability for applying bias power to substrate 138. Adjustable-height chuck 140 includes passageway 142 for receiving wafer lift pin 144. Wafer lift pin 144 lifts substrate 138 as chuck drive shaft 146 moves chuck 140 downward, in order to enable loading or unloading of substrate 138.

FIG. 5 depicts an isolated view of VHIC ionization coil segment 116 and RF power supply 126. Specifically, FIG. 5 shows a substantially cylindrical (although it can be substantially conic as well) VHIC ionization coil segment 116 of the first embodiment of this invention, which can be arranged peripherally such that it surrounds the TCP PVD plasma medium between target 600 and substrate 138 of FIG. 4. VHIC ionization coil segment 116 is depicted in FIG. 5 with three coil loops 120, but it may have one, two, three or more coil loops 120 (preferably two to four). VHIC ionization coil segment 116 (and coil loops 120) are preferably made of hollow copper or aluminum tubing with internal recirculating water flow for cooling. VHIC ionization coil segment 116 is shown operated as a single-zone antenna, although it can be operated as a multi-zone antenna. Alternatively, the three-coil loops 120 VHIC ionization coil segment 116 shown in FIG. 5 can be operated as three inductive zones using either one or two to three power supplies. This configuration is shown and explained in FIG. 8.

FIG. 5 further depicts the preferred employment of an electrically insulating (dielectric) liner 149 composed of inner liner 150 and outer liner 151 attached to and surrounding coil loops 120 of VHIC ionization coil segment 116. Liner 149 can be made of a ceramic material such as aluminum oxide. Inner metallic electrostatic shield 152 is attached to inner liner 150 and outer metallic electrostatic shield 153 can be optionally attached to outer liner 151. Liner 149 prevents exposure of coil loops 120 of VHIC ionization coil segment 116 to the ICP PVD plasma and prevents etching/sputtering of their material. Inner and outer metallic electrostatic shields 152 and 153 can be made of titanium (Ti) or some other hard material, such as stainless steel, and are preferably hard enough to withstand sandblasting, and are also preferably coated with arc sprayed aluminum (or other material) to improve adhesion of deposited films.

Metallic electrostatic shields 152 and 153 can have slots 500, as shown in FIGS. 10B and 11B. Inner and outer metallic electrostatic shields 152 and 153 can also be electrically grounded to effectively shield and protect VHIC ionization coil segment 116 and inner and outer liners 150 and 151 from sputtering by the process plasma. Moreover, inner and outer metallic electrostatic shields 152 and 153 are not etched or sputtered because the plasma potential near them is too low. Slots 500 in inner and outer electrostatic shields 152 and 153 allow penetration of the inductive magnetic field through them for process plasma ionization and density enhancement. Additionally, when VHIC ionization coil segment 116 is in the form of a cylindrical coil, slots 500 provide an additional advantage by disrupting the eddy current path that is formed as a result of the cylindrical antenna coil. Slots 500 in inner and outer metallic electrostatic shields 152 and 153 prevent the eddy currents from circulating and thus tend to eliminate any RF-induced eddy current losses in themselves.

FIGS. 6 and 7 further describe the first embodiment of the improved ICP PVD apparatus of this invention. FIG. 6 is a more detailed depiction of the same ICP PVD fabrication reactor process chamber 100 depicted in FIG. 4. More specifically, FIG. 6 shows VHIC ionization coil segment 116 in the down or wafer-handling position. As in FIG. 5, VHIC ionization coil segment 116 is shown with three coil loops 120. VHIC ionization coil segment 116 is enclosed by inner liner 150 and outer liner 151. A variation of liner 149 is shown. Instead of being continuous around VHIC ionization coil segment 116 and in contact with one another, inner liner 150 and outer liner 151 are instead walls of an enclosure; i.e., inner liner 150 and outer liner 151 are capped by bottom cap 156 and top cap 158. Top and bottom caps 158 and 156 can be made of a ceramic material such as aluminum oxide The liners 150, 151, 156 and 158 are designed to be easily removable for cleaning.

FIGS. 6 and 7 also show inner metallic electrostatic shield 152 attached to inner liner 150. Outer metallic electrostatic shield 153 is not shown. It is less critical and is optional because the outer diameter of outer liner 151 can be chosen such that it is very close to the inner diameter of vacuum chamber sidewalls 102 of process chamber 100. In such a case, the plasma from the vapor deposition process cannot typically get into the region between outer liner 151 and vacuum chamber sidewalls 102. Also deposition can be avoided on this surface because of shielding.

Inner and outer metallic electrostatic shields 152 and 153 are grounded, i.e., attached to a reference potential. VHIC ionization coil segment 116 may have a high RF-induced voltage which inner and outer electrostatic shields 152 and 153 screen out as a result of being grounded. There is, therefore, a reduction in the attraction and acceleration of the process plasma ions toward inner and outer liners 150 and 151. If inner and outer metallic electrostatic shields 152 and 153 were not present and grounded, liner 149 could be sputtered. Although liner 149 encapsulates VHIC ionization coil segment 116 to keep it from being sputtered, the RF-induced voltage in VHIC ionization coil segment 116 attracts the process plasma ions to itself, thus sputtering liner 149. Grounding of inner and outer metallic electrostatic shields 152 and 153 prevents this by creating a reference potential that decouples the RF-induced voltage in VHIC ionization coil segment 116 from the process plasma and prevents or substantially eliminates acceleration of the plasma ions toward VHIC ionization coil segment 116. As a result, VHIC ionization coil segment 116, liner 149 and inner and outer metallic electrostatic shields 152 and 153 are not consumed by the ICP PVD process.

Slots 500 of FIGS. 10B and 11B in inner and outer metallic electrostatic shields 152 and 153 allow the magnetic field produced by VHIC ionization coil segment 116 to penetrate into the process medium (process plasma). Slots 500 are shown in FIGS. 10B and 11B as essentially perpendicular to top edge 700 and bottom edge 702 of inner and outer metallic electrostatic shields 152 and 153. However, the orientation of slots 500 can be varied as necessary (e.g., slanted) to maximize magnetic field penetration through and/or to minimize eddy current losses in inner and outer electrostatic shields 152 and 153.

FIGS. 6 and 7 show VHIC ionization coil segment 116 as a single-zone inductively-coupled antenna. In such a configuration, VHIC ionization coil segment 116 can be powered as described above for FIG. 4. The power source configuration when VHIC ionization coil segment 116 is constructed as a multi-zone inductively-coupled antenna is likewise the same as previously discussed for FIG. 4.

VHIC ionization coil segment 116 is shown in FIGS. 6 and 7 operating as a single-zone antenna with three coil loops 120. Alternatively, the three coil loops 120 of VHIC ionization coil segment 116 can be operated as three separate inductive zones, using either one or two to three power supplies. This configuration is shown in and explained in FIGS. 8A–8C.

For collimated deposition, an electrical (RF, DC or pulsed DC/AC) bias is applied to substrate 138 through variable-height chuck 140 while VHIC ionization coil segment 116 is RF powered. VHIC ionization coil segment 116 provides ionization of the sputtered species emitted from target 600. Variable-height chuck 140 bias results in collimation of the ionized portion of the sputtered flux. The degree of ICP PVD collimation can be increased by increasing the amount of RF power to VHIC ionization coil segment 116 and/or by increasing the amount of electrical bias applied to substrate 138 through variable-height chuck 140. This degree of collimation can be varied either continuously or in a step wise fashion during the deposition. The vertical axial position perpendicular to substrate 138 of VHIC ionization coil segment 116 (relative to cathode/target assembly 134 and substrate 138) can be adjusted by up/down actuation mechanism and RF feedthrough 124 and antenna drive 122 to optimize the process and collimation uniformity of the ICP PVD process.

The adjustable height feature of the first embodiment of the improved ICP PVD apparatus of this invention provides the capability for optimization of deposition and collimation uniformity of the ICP PVD process over a wide range of process conditions (for example, over a wide range of PVD pressures, substrate-to-target spacings, etc.). Together FIGS. 6 and 7 show the range of motion of VHIC ionization coil segment 116. FIG. 6 shows VHIC ionization coil segment 116 in the down, or wafer-handling, position. FIG. 7 shows VHIC ionization coil segment 116 in the extreme-up position. In operation, up/down activation mechanism and RF feed-through 124 and antenna drive 122 cooperate to adjust, in response to changed process conditions, the height of VHIC ionization coil segment 116 in real-time between the two extremes shown in FIGS. 6 and 7. For example, in response to a change in ICP PVD process pressure, up/down activation mechanism and RF feed-through 124 and antenna drive 122 might increase or decrease VHIC ionization coil segment 116 height to optimize deposition and collimation uniformity.

Additionally, it is advantageous to be able to retract VHIC ionization coil segment 116 to the down position because it allows wafer transfers to occur without blocking the wafers. Wafer transfer occurs via wafer transport valve 110 and use of a wafer-handling robot. If VHIC ionization coil segment 116 were fixed, it would have to be fixed in the up position at all times so as to not block wafer transport valve 110 and process uniformity could then not be adjusted in real time.

The description of FIG. 7 otherwise generally follows that of FIGS. 6 and 4. FIG. 7 additionally shows substrate 138 in the clamped position on adjustable-height chuck 140, here shown as a two-zone chuck assembly. FIG. 7 depicts a typical wafer process position which, although here shown in the extreme up-most position of VHIC ionization coil segment 116, can correspond to any VHIC ionization coil segment 116 position between the wafer-handling and extreme-up positions of FIGS. 6 and 7.

Figure 8B:
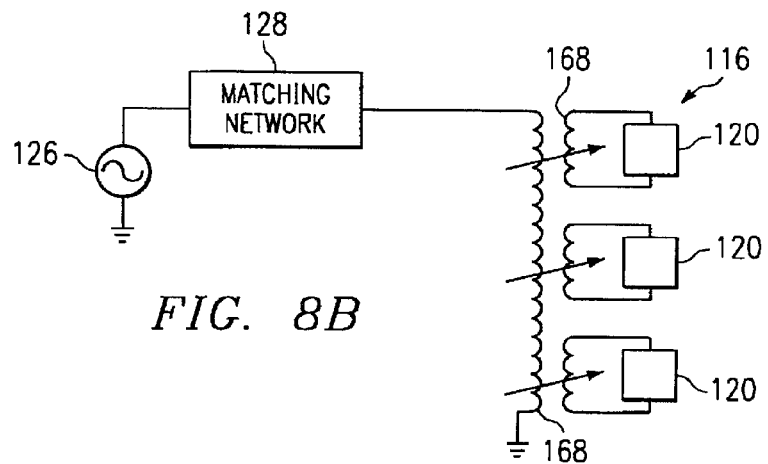
Figure 8C:
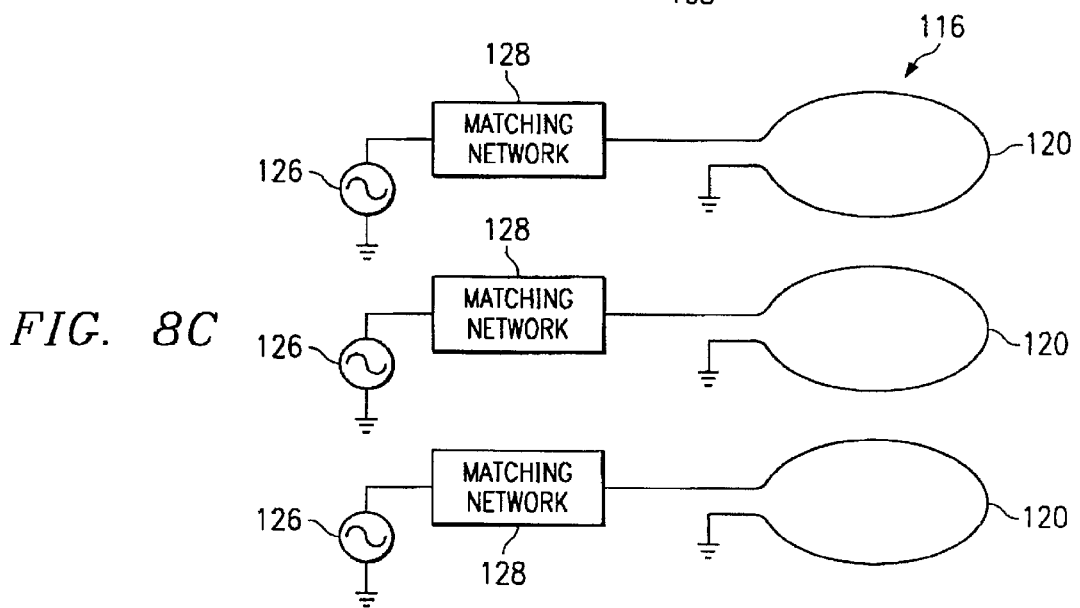

FIGS. 8A, 8B and 8C show VHIC ionization coil segment 116 with three coil loops 120 operated as three inductive zones using either a single RF power supply 126 (FIGS. 8A and 8B) or three RF power supplies 126 (FIG. 8C). FIG. 8A shows VHIC ionization coil segment 116 configured as a three loop antenna having three coil loops 120 (but it can be an n-loop antenna with n $\geq 2$) using a single RF power supply 126 and capacitive coupling to antenna coil loops 120. FIG. 8A shows each zone with a single coil loop 120, however, each zone may contain more than one coil loop 120. Adjustable real-time capacitors 160 couple RF power supply 126 and matching network 128 to coil loops 120. Adjustable real-time capacitors 160 can operate in conjunction with real-time multi-zone controller 164, together forming an adjustable electrical component, to provide real-time control of the relative amounts of RF current flowing into each coil loop 120(or each zone comprising one or more coil loops 120) of VHIC ionization coil segment 116 for process and collimation uniformity optimization.

Grounding capacitors 162, which can be of the same value as adjustable real-time capacitors 160, can likewise be adjustable real-time capacitors. If so, they too could use an adjustable real-time multi-zone controller 164(for example, servo motors) to match the values of adjustable real-time capacitors 160 to balance capacitance at both ends. Through proper matching of the grounding and coupling capacitors the RF potential on the antenna can be minimized. Grounding capacitors 162, however, need not be adjustable via an adjustable real-time multi-zone controller 164. FIG. 8a shows the preferred embodiment using grounding capacitors 162 and adjustable real-time capacitors 160 to couple coil loops 120 to RF power supply 126 via matching network 128.

FIG. 8B shows a three-zone VHIC ionization coil segment 116 having three coil loops 120 coupled to a single power supply 126 using adjustable transformer coupling to control the relative current into the different zones. RF power supply 126 is connected to matching network 128, which is coupled to coil loops 120 of VHIC ionization coil segment 116 through individually adjustable transformer coils 168. Individually adjustable transformer coils 168 can be an auto-transformer consisting of a single primary and three secondary loops (as shown), each individually adjustable to permit variable spacing. This allows for individual adjustment of the power into each zone. VHIC ionization coil segment 116 can be configured either as a single-zone ICP PVD antenna or as an m-zone ICP PVD antenna, where $1 \leq m \leq n$, and where n is the number of coil loops 120.

FIG. 8C shows a third method of powering and coupling, via an adjustable electrical component, VHIC ionization coil segment 116. The embodiment of VHIC ionization coil segment 116 of FIG. 8C is shown in a three-zone configuration, each zone being comprised of a single coil loop 120. Unlike FIG. 8A or 8B, there are no adjustable capacitors or adjustable transformers. Instead, each of the three coil loops 120 is connected to an RF power supply 126 through a matching network 128. Each zone is therefore powered by a separate power supply 126 and matching network 128; grounding capacitor 162 may optionally be used.

Figure 9A:
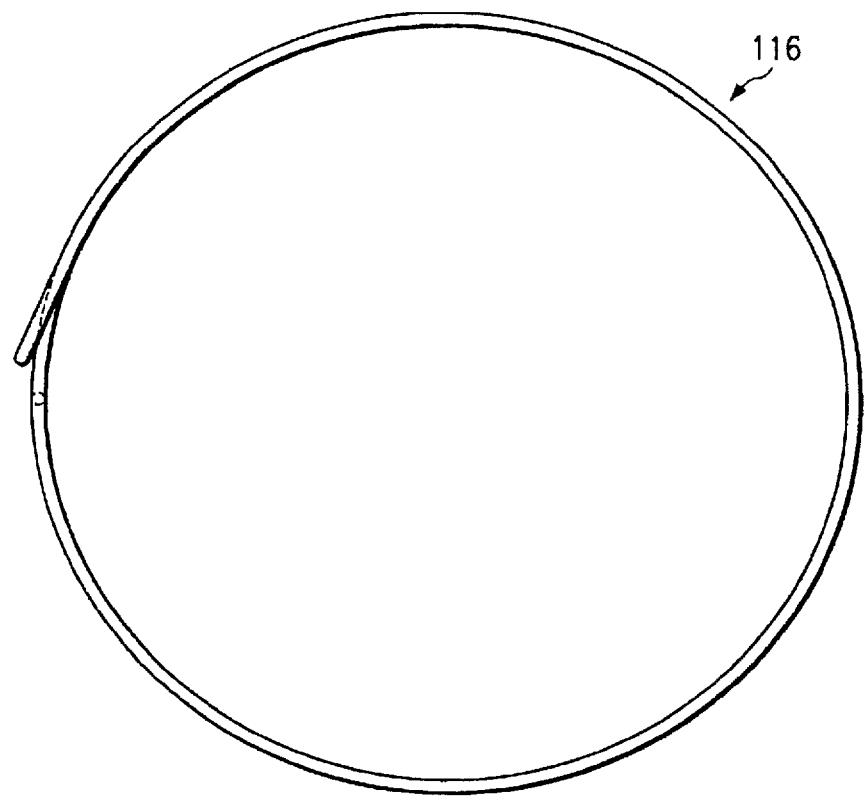
FIGS. 9A and 9B show the inductively-coupled ionization coil segment of the first embodiment of this invention.
Figure 9B:
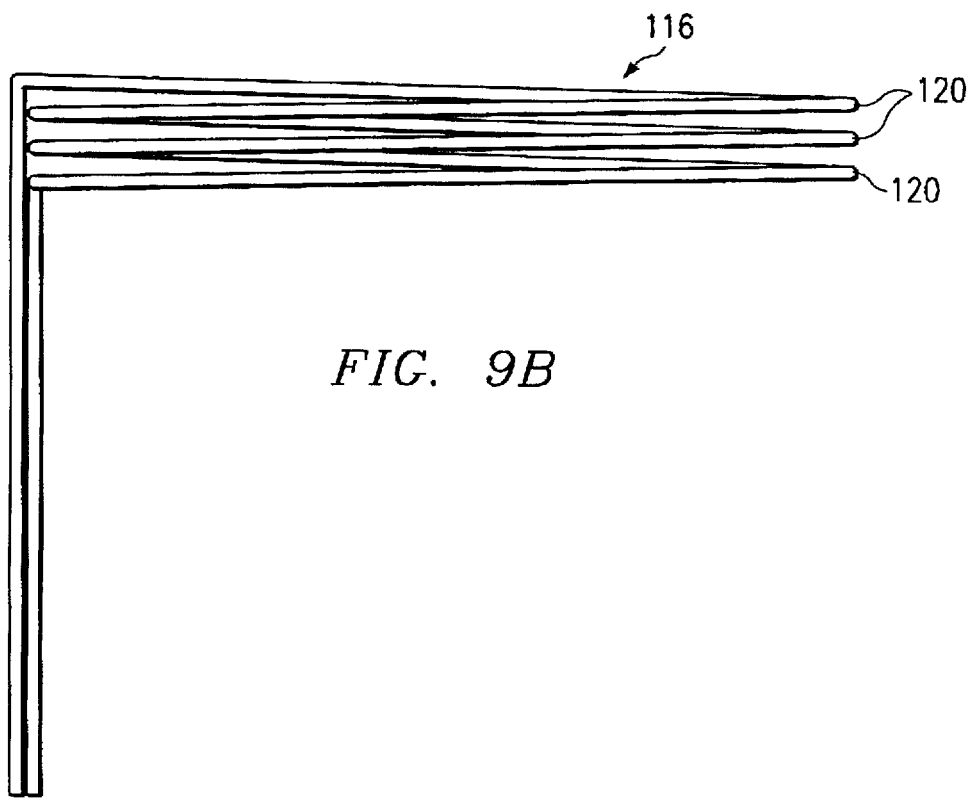

FIGS. 9A and 9B show VHIC ionization coil segment 116 of the first embodiment of the improved ICP PVD apparatus of the present invention in a single-zone, three-coil loop 120 configuration. Specifically, FIGS. 9A and 9B show VHIC ionization coil segment 116 made of silver-plated copper or aluminum. These are the preferred materials to help minimize RF losses in VHIC ionization coil segment 116 itself. As shown in FIGS. 9A and 9B, VHIC ionization coil segment 116 can have an outer diameter of 0.25 inches. FIGS. 9A and 9B also show only one possible layout for VHIC ionization coil segment 116 along with one possible set of angles of manufacture and ratio of dimensions for VHIC ionization coil segment 116. Any angles and ratio of dimensions shown in FIGS. 9A and 9B are illustrative only. While VHIC ionization coil segment 116 is shown in FIGS. 9A and 9B in a three-coil loop 120 configuration, VHIC ionization coil segment 116 can contain from one to n coil loops 120, where n is typically between 2 to 4 ($2 \leq n \leq 4$).

FIGS. 10A and 10B show optional outer metallic electrostatic shield 153 of the first embodiment of the improved ICP PVD apparatus of this invention: FIG. 10A shows a top view and FIG. 10B a side view. Outer metallic electrostatic shield 153 can be fabricated as a strip and then rolled and welded into a cylindrical shape or other appropriate shape to fit the outer perimeter of VHIC ionization coil segment 116 and its outer liner 151. Outer metallic electrostatic shield 153, when present, can be attached to and held in place by inner metallic electrostatic shield 152. Outer metallic electrostatic shield 153 can be made of titanium or some other hard material, such as stainless steel, or can be nickel plated, and is preferably hard enough to withstand sandblasting as a method of cleaning for reuse.

If the outer diameter of outer liner 151 is not large enough to minimize the spacing between vacuum chamber sidewalls 102 and outer metallic electrostatic shield 153, then there is a chance of plasma sputtering outer liner 151, as process plasma can be sustained if this spacing is sufficiently large. In that event, the use of outer metallic electrostatic shield 153 is preferred. As shown in FIG. 10B, outer metallic electrostatic shield 153 is a slotted shield, containing a plurality of slots 500. The dimensions shown in FIGS. 10A and 10B are representative only, and can be changed to fit the size of VHIC ionization coil segment 116 as used in a given process. Slots 500 in outer metallic electrostatic shield 153 are shown as essentially vertical, i.e., with the long axis of slots 500 perpendicular to the top and bottom edges 700 and 702, respectively, of outer metallic electrostatic shield 153. However, they can be varied (for example, to an oblique angle) as necessary to maximize magnetic field penetration from VHIC ionization coil segment 116 through outer metallic electrostatic shield 153 for ionization of the process plasma (i.e., for inductive coupling of the magnetic field to the plasma).

FIGS. 11A and 11B show top and side views, respectively, of slotted inner metallic electrostatic shield 152. The description of FIGS. 11A and 11B are essentially the same as those of FIGS. 10A and 10B. Inner metallic electrostatic shield 152 can be made of titanium, or some other hard metallic material such as stainless steel, and is preferably hard enough to withstand sandblasting as a method of cleaning. Unlike outer metallic electrostatic shield 153 (shown in FIGS. 10A and 10B), inner metallic electrostatic shield 152 should not just be nickel coated. This is because more of the area of inner metallic electrostatic shield 152 is exposed to the process plasma than is the case with outer metallic electrostatic shield 153. Inner metallic electrostatic shield 152 can be essentially a fabricated strip of metal, such as titanium, which is then rolled and welded into cylindrical shape (or other appropriate shape) to fit the shape of inner liner 150 of VHIC ionization coil segment 116. Slot 500 size and any other dimensions shown in FIGS. 11A and 11B are representative only and can be varied as needed. Slots 500 in inner metallic electrostatic shield 152 serve the same purpose and can be manufactured and oriented in the same manner as slots 500 in outer metallic electrostatic shield 153.

Over time, sputtering can start to deposit or coat target 600 material on the surfaces of inner and outer liners 150 and 151 that are exposed through slots 500 of inner and outer metallic electrostatic shields 152 and 153. In the case of outer liner 151, this can only occur when outer metallic electrostatic shield 153 is used. The surfaces of inner and outer liners 150 and 151 exposed by slots 500 can become covered with target 600 material to the point where slots 500 are themselves covered over, resulting in the magnetic field being prevented from going through slots 500 of both inner and outer metallic electrostatic shields 152 and 153.

To prevent this, one variation of the improved ICP PVD apparatus of this invention calls for angled sputter shield fins to be incorporated into slots 500. FIG. 11C shows angled sputter shield fins 170 bent out at an angle from 15° to 75° from the plane formed by inner or outer electrostatic shields 152 and 153 before being shaped to fit liner 149 of VHIC ionization coil segment 116. Sputter shield fins 170 can be formed from the slot 500 cut itself by punching out the material removed to form slots 500 and bending it into the required angle as shown in FIG. 11C. Sputter shield fins 170 eliminate the line of path of the sputtering flux that would otherwise coat inner and outer liners 150 and 151 of liner 149. Instead, sputter shield fins 170 are coated and the magnetic field is allowed to get through slots 500 and ionize the process plasma.

FIG. 11D shows another variation of sputter shield fins 170. Tips 502 of sputter shield fins 170 can be bent down at an angle between 15° and 35° from the angle of the main portion of the fin to further prevent sputtering of underlying liners 150 and 151 (not shown). Yet another variation of sputter shield fins 170 is shown in FIG. 11E. In FIG. 11E sputter shield fins 170 are shown with tips 502 bent down and then inward to form a V-shape. In any embodiment of this invention which incorporates sputter shield fins 170, the diameter of adjustable height chuck 140 of FIG. 4 must be such that it allows for clearance between itself and sputter shield fins 170 of inner metallic electrostatic shield 152(i.e., the diameter of adjustable height chuck 140's housing must be less than the diameter of inner metallic electrostatic shield 152 with sputter shield fins 170). FIG. 11F is another embodiment showing Venetian blind style overlapping fins to prevent all line of sight deposition on the liners.

Figure 12:
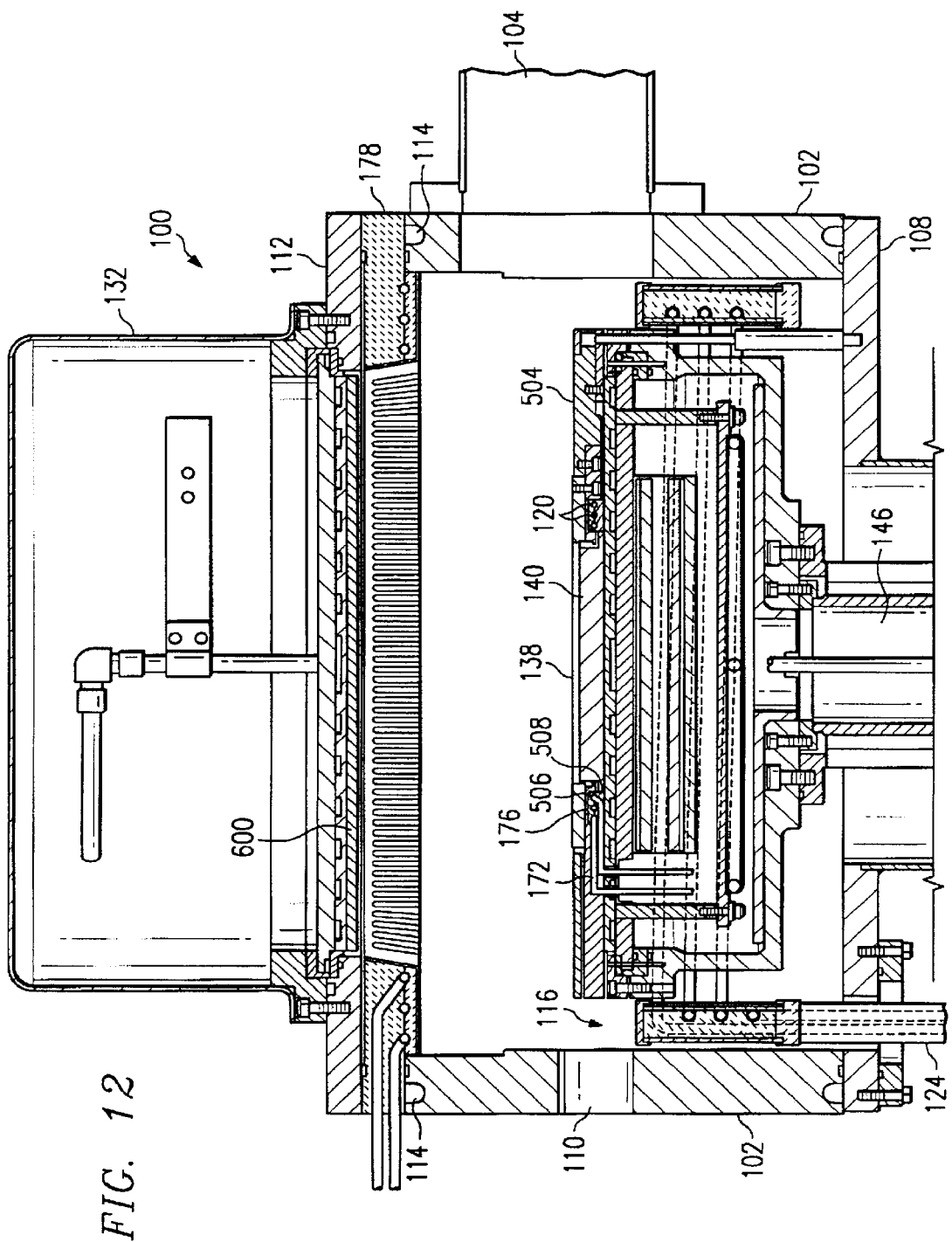
FIG. 12 shows an ICP PVD fabrication process chamber with a second embodiment of this invention as well as the first embodiment of this invention.

FIG. 12 shows a second embodiment of the improved ICP PVD apparatus of this invention comprising a planar or substantially planar antenna coil 172 (antenna coil 172 can also be either a conic or graded slope coil) embedded in antenna housing (not shown in FIG. 12) which is attached on top of variable height chuck 140 (as shown) or, alternatively, to clamp table 504. FIG. 12 also shows the first embodiment and a third embodiment of the improved ICP PVD apparatus of the present invention. The third embodiment will be described in FIGS. 17 through 24. Adjustable height chuck 140 is shown in FIG. 12 as a cold chuck, although in any embodiment of this invention adjustable height chuck 140 can be either a hot chuck or a cold chuck.

Antenna coil 172 of the second embodiment of this invention surrounds substrate 138 (the wafer) and can comprise one to n coil loops 120(where n=1, 2, 3 . . . ). Antenna coil 172 can be configured either as a single-zone antenna or as a multi-zone antenna and can be a spiral or a circular antenna. Antenna coil 172 can be made from hollow-copper or aluminum tubing to provide for internal recirculating water cooling. Antenna coil 172 can also be externally silver-plated to reduce ohmic losses. Antenna coil 172 has an inner loop diameter that can be somewhat larger than the wafer (substrate 138) diameter and adjustable height chuck 140 pedestal diameter. Antenna coil 172 can be positioned below or slightly above the wafer plane and is supported either on adjustable height chuck 140 or on clamp table 504.

The antenna housing encloses antenna coil 172. Housing comprises an upper housing half 506 and a lower housing half 508 surrounding antenna coil 172. Housing can be made of a ceramic material such as aluminum oxide.

Top metallic shield 176 attaches to and covers the top of housing to prevent sputter etching of housing. Top metallic shield 176 is analogous to inner and outer metallic electrostatic shields 152 and 153 described in the first embodiment of this invention and can similarly be a slotted shield. Top metallic shield 176 can be grounded to operate effectively as an electrostatic shield. Slots 500 (as shown in FIGS. 10B and 11B) in top metallic shield 176 serve the same purpose and can be manufactured and oriented in the same manner as slots 500 in inner and outer metallic electrostatic shields 152 and 153 of the first embodiment of this invention. Slots 500 in top metallic shield 176 can also incorporate sputter shield fins 170, shown in FIGS. 11C, 11D, 11E and 11F to prevent coating of housing at slots 500 by the ICP PVD process material. Top metallic shield 176 can be made of titanium or some other hard material such as stainless steel.

FIG. 12 also shows a third embodiment of the improved ICP PVD apparatus of this invention contained within lid lift insert 178 between vacuum top lid 112 and vacuum chamber sidewalls 102. The third embodiment of this invention will be described more fully in FIGS. 17 through 24.

Figure 13:
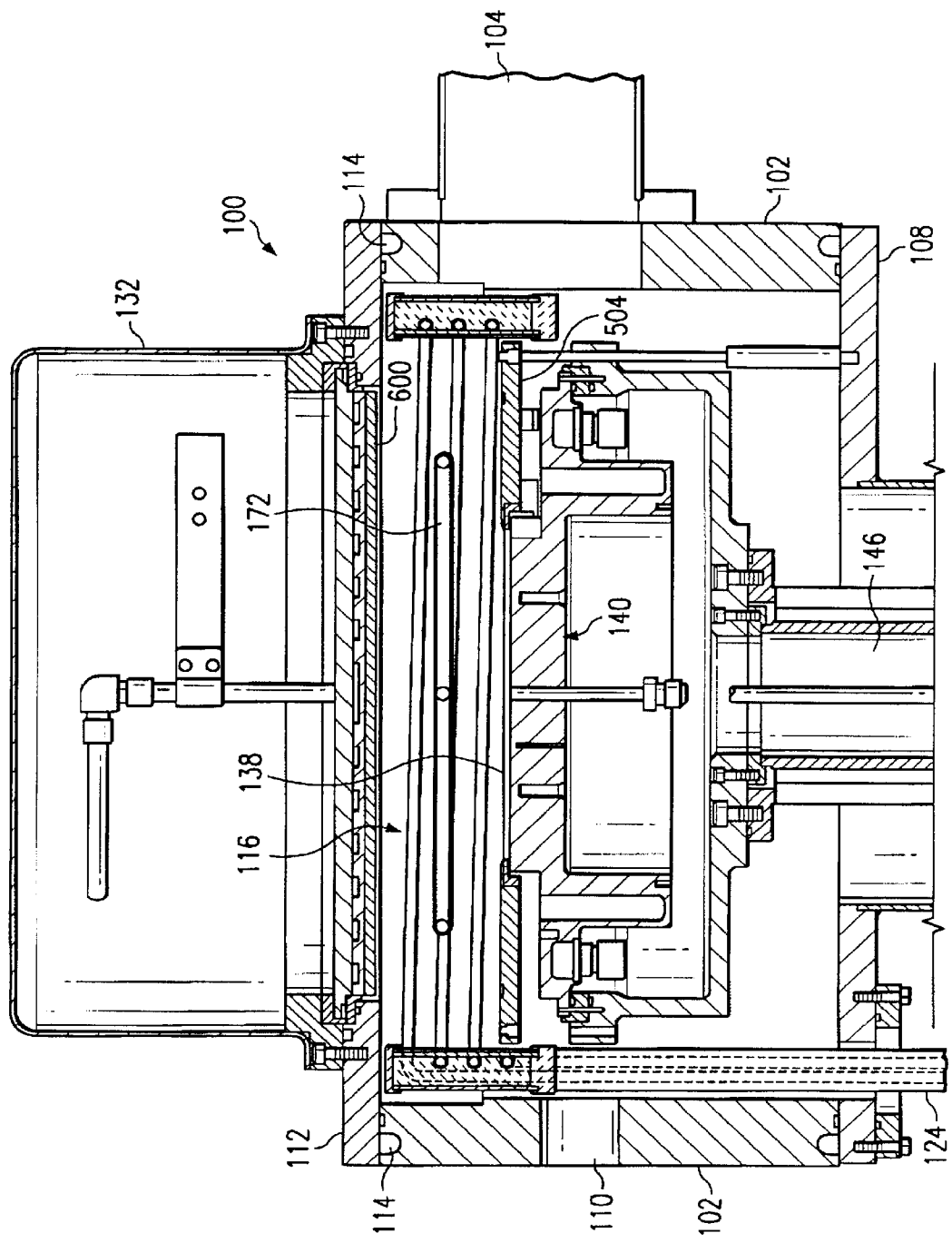
FIG. 13 shows an ICP PVD fabrication process chamber with a variation of the second embodiment of this invention as well as the first embodiment of this invention.

FIG. 13 is a conceptual drawing of a variation of the second embodiment of this invention. Antenna coil 172 is in a raised position at a finite distance, d, from substrate 138. In this variation of the second embodiment, antenna coil 172 is not encased in housing of FIG. 12, but is instead directly exposed to the process plasma. The supports and power feed-throughs for antenna coil 172 are not shown, but any conventional supports and power feed-throughs can be used. The description of FIG. 13 is otherwise similar to that of FIG. 12. However, unlike the variation shown in FIG. 13, antenna coil 172 in FIG. 12 is encased in housing and is not directly exposed to the process plasma. Antenna coil 172 in FIG. 12 is therefore not sputtered or etched by the process plasma.

Figure 14:
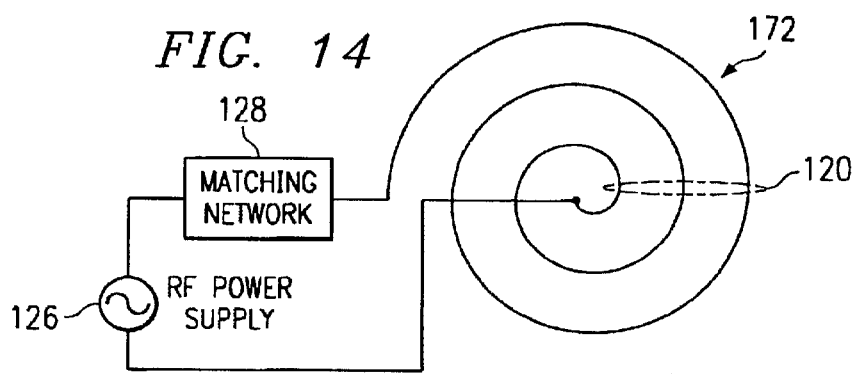
FIGS. 14 and 15 show variations of ionization antenna power and capacitive coupling networks.
Figure 15:
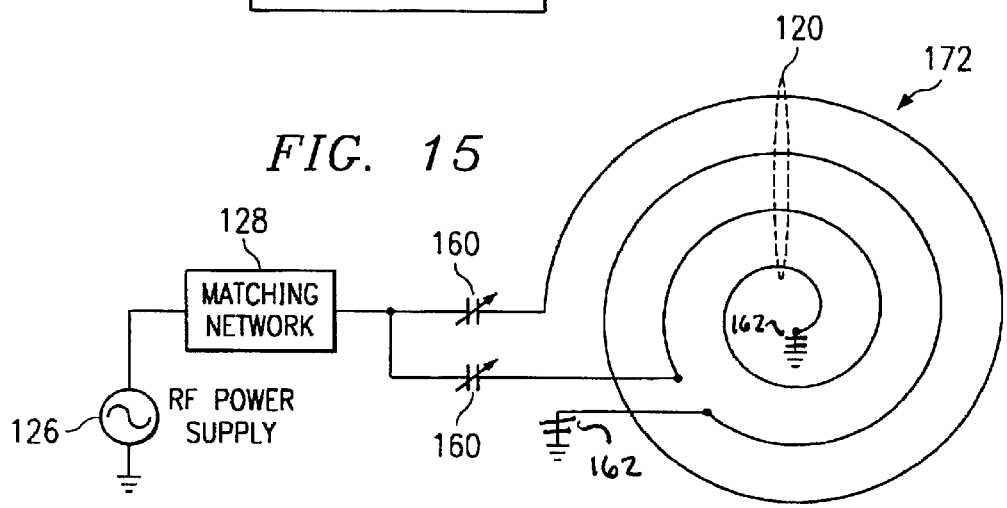

FIGS. 14 and 15 show inductive-coupling layouts for the second embodiment of this invention analogous to those described in FIGS. 8A–8C for the first embodiment of this invention. FIG. 14 shows antenna coil 172 configured as a single-zone planar antenna having three coil loops 120 (but it can be an n-loop antenna with n≧3) powered using a single RF power supply 126 connected through matching network 128. Although FIG. 14 shows antenna coil 172 as a single-zone, three coil loop 120 antenna, antenna coil 172 can have multiple zones, with each zone consisting of one or more coil loops 120.

FIG. 15 shows planar antenna coil 172 configured as a two-zone antenna, with each zone having two coil loops 120. Antenna coil 172 is powered with a single RF power supply 126 connected to matching network 128, which is connected to adjustable real-time capacitors 160. Adjustable real-time capacitors 160 are connected to antenna coil 172. Like in FIG. 8A, Adjustable real-time capacitors 160 can be controlled by an optional adjustable real-time multi-zone controller 164 (not shown); grounding capacitor 162 can also optionally be used.

The relative amounts of RF current in each zone of antenna coil 172 of FIG. 15 can be adjusted (for the best ICP PVD process uniformity) by varying the capacitance values of adjustable real-time capacitors 160. If desired, it is possible to utilize an inductive-transformer coupling network (with adjustable inductive coupling ratios) analogous to the layout depicted in FIG. 8B using individually adjustable transformer coil 168. Furthermore, it is possible to use two (or n for an n-zone arrangement) RF power supplies 126 to drive antenna coil 172 to establish the best process uniformity.

Figure 16:
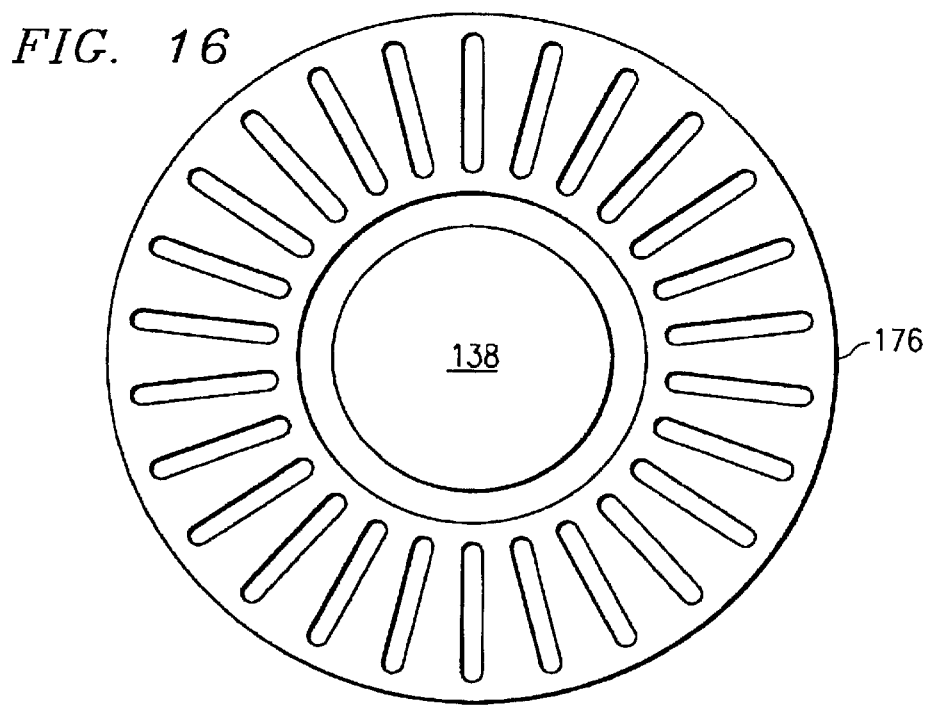
FIG. 16 shows a conceptual top view of the slotted top metallic shield of the second embodiment described in FIG. 12.

FIG. 16 shows a conceptual top view of top metallic shield 176 of the second embodiment of the improved ICP PVD apparatus of this invention. Top metallic shield 176 is attached to and over housing of FIG. 12, which contains antenna coil 172. The inner diameter of top metallic shield 176 is greater than the outer diameter of substrate 138 (seen here centered within top metallic shield 176) so that, as in the first embodiment of this invention, top metallic shield 176 can incorporate sputter shield fins 170 attached to and as part of slots 500. Furthermore, as in the first embodiment, sputter shield fins 170 can be bent as shown in FIGS. 11C, 11D, 11E and 11F.

Figure 17:
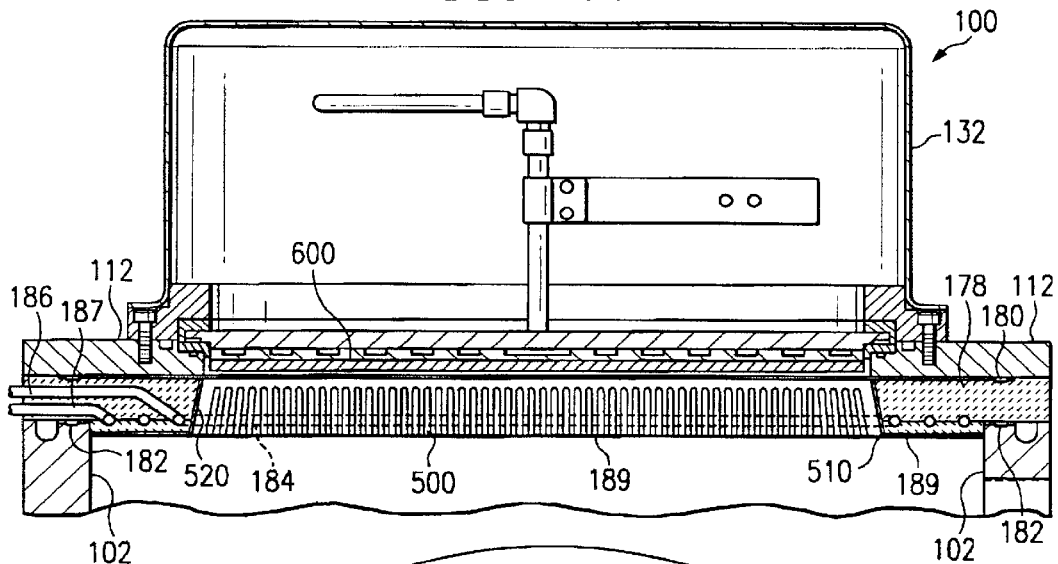
FIG. 17 shows a side cut-away view of an ICP PVD fabrication process chamber with a third embodiment of this invention.

FIGS. 17 through 24 show variations of a third embodiment of the improved ICP PVD apparatus of this invention. FIG. 17 shows a side cut-away view of an ICP PVD fabrication reactor process chamber 100. Only the upper portion of process chamber 100 is shown. Dielectric lid lift insert 178 can be attached between vacuum top lid 112 and vacuum chamber sidewalls 102. Dielectric lid lift insert 178 surrounds and supports inductive antenna tubing 184. Dielectric lid lift insert 178 can be made of a ceramic material such as aluminum oxide. Inductive antenna tubing 184 can be embedded within dielectric lid lift insert 178 during manufacture. Inductive antenna tubing 184 can be a substantially planar or cone shaped antenna, preferably made of hollow aluminum or copper tubing.

Top elastomer vacuum seal 180 creates a vacuum seal between dielectric lid lift insert 178 and vacuum top lid 112. Bottom elastomer vacuum seal 182 creates a vacuum seal between vacuum chamber sidewalls 102 and dielectric lid lift insert 178. RF connection/cooling inlet 186 and RF connection/cooling outlet 187 provide for recirculating cooling water flow through inductive antenna tubing 184. RF connection/cooling inlet 186 and RF connection/cooling outlet 187 also provide a connection path between inductive antenna tubing 184, matching network 128 and RF power supply 126, as well as either a capacitive or inductive coupling network (as shown in FIGS. 8A, 8B and 8C). Matching network 128, RF power supply 126 and the inductive and capacitive coupling networks are not shown in FIG. 17. Electrostatic shield 189 is attached with fasteners, such as clips, to the bottom of dielectric lid lift insert 178 (the side of dielectric lid lift insert 178 that is opened to the interior of process chamber 100).

Electrostatic shield 189 is analogous to top metallic shield 176 from FIGS. 12 and 13 and to metallic electrostatic shields 152 and 153 of FIGS. 4 and 6. Electrostatic shield 189 can be mounted essentially flush with the underside of dielectric lid lift insert 178. Inner diameter 510 of the shield lip can be bent upwards to provide coverage to the inner diameter of dielectric lid lift insert 178. Electrostatic shield 189 is grounded and can be made of titanium or a material similar to the material of target 600.

Electrostatic shield 189 contains a plurality of slots 500 to prevent sputtering of dielectric lid lift insert 178, which in turn prevents sputtering and consuming of inductive antenna tubing 184. Electrostatic shield 189 can also incorporate sputter shield fins 170 (which are not shown in FIG. 17) to further prevent sputtering of the exposed sections of dielectric lid lift insert 178. The thickness of dielectric lid lift insert 178 between inductive antenna tubing 184 and electrostatic shield 189 should be significantly less than that between inductive antenna tubing 184 and vacuum top lid 112. This ensures that most of the energy coming from inductive antenna tubing 184 is coupled into the process plasma as opposed to being coupled into vacuum top lid 112.

Figure 18:
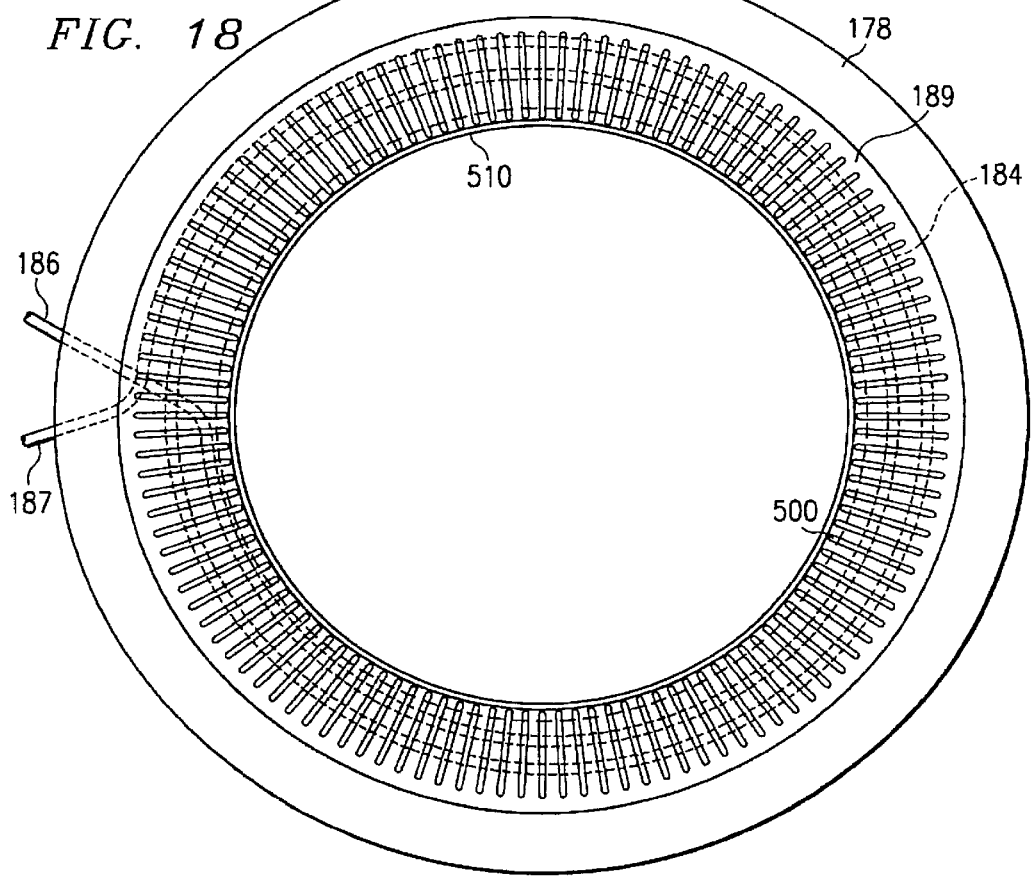
FIG. 18 depicts the underside of the electrostatic shield of the third embodiment described in FIG. 17.

FIG. 18 shows a view looking upward to the bottom of electrostatic shield 189, including dielectric lid lift insert 178 and inductive antenna tubing 184 (shown in hidden lines). Electrostatic shield 189 can be bent upwards along its inner diameter 510 to protect the inner diameter of dielectric lid lift insert 178. FIG. 18 also depicts a substantially planar inductive antenna tubing 184 having RF connection/cooling inlet 186 and RF connection/cooling outlet 187.

Dielectric lid lift insert 178 of this third embodiment of the improved ICP PVD apparatus of this invention is better protected because it does not have a direct line of sight view of target 600. This results in coating of dielectric lid lift insert 178 at the openings of slotted electrostatic shield 189 occurring at a much slower rate. Electrostatic shield 189 can include slanted sidewalls 520 to better protect dielectric lid lift insert 178.

Many of the same general concepts apply in the third embodiment of this invention as in the first embodiment. The same or similar inductive or capacitive coupling networks as were used for the first embodiment (as shown in FIGS. 8A, 8B and 8C) are equally applicable to the third embodiment of this invention. Likewise, electrostatic shield 189 can be finned using various configurations of sputter shield fins 170 as shown in FIGS. 11C, 11D and 11E. Inductive antenna tubing 184 can have n coil loops 120 (n=1, 2, 3, . . . ) and may be configured either as a single-zone antenna or a multi-zone antenna, with each zone having one -or more coil loops 120. For instance, inductive antenna tubing 184 with three coil loops 120 may be configured as: (1) a single-zone three-coil loop 120 antenna; (2) as a two-zone antenna with the inner and outer zones comprising one and two/or two and one coil loops 120; (3) as a three-zone antenna, each zone having one coil loop 120.

Multi-zone configurations may use a single RF power supply 126 or multiple RF power supplies 126 in conjunction with an adjustable capacitive or inductive transformer coupling circuit to provide the capability for multi-zone adjustment and optimization of process uniformity. This is analogous to the networks used in the first embodiment of this invention and shown in FIGS. 8A, 8B and 8C.

Preferably, inductive antenna tubing 184 will have one to three coil loops 120. With a multi-coil loop. 120 arrangement, the inner coil loop 120 is set up to have a diameter slightly larger than the diameter of target 600 (for a circular target 600, inductive antenna tubing 184 can be circular or spiral). The outer coil loop 120 of inductive antenna tubing 184 is chosen to be somewhat smaller than the diameter of process chamber 100. Inductive antenna tubing 184 of this third embodiment of this invention is approximately planar with the target 600 plane and surround its periphery. This results in an effective ionization of the sputtered species from target 600 in the plasma medium near the target 600 surface. Of importance is that configuration of inductive antenna tubing 184 of this third embodiment of this invention does not block the line of sight between target 600 and substrate 138. This is because inductive antenna tubing 184 (and its associated dielectric lid lift insert 178 and electrostatic shield 189) surround cathode/target assembly 134 rather than being located in the space between target/cathode assembly 134 and substrate 138.

Figure 19:
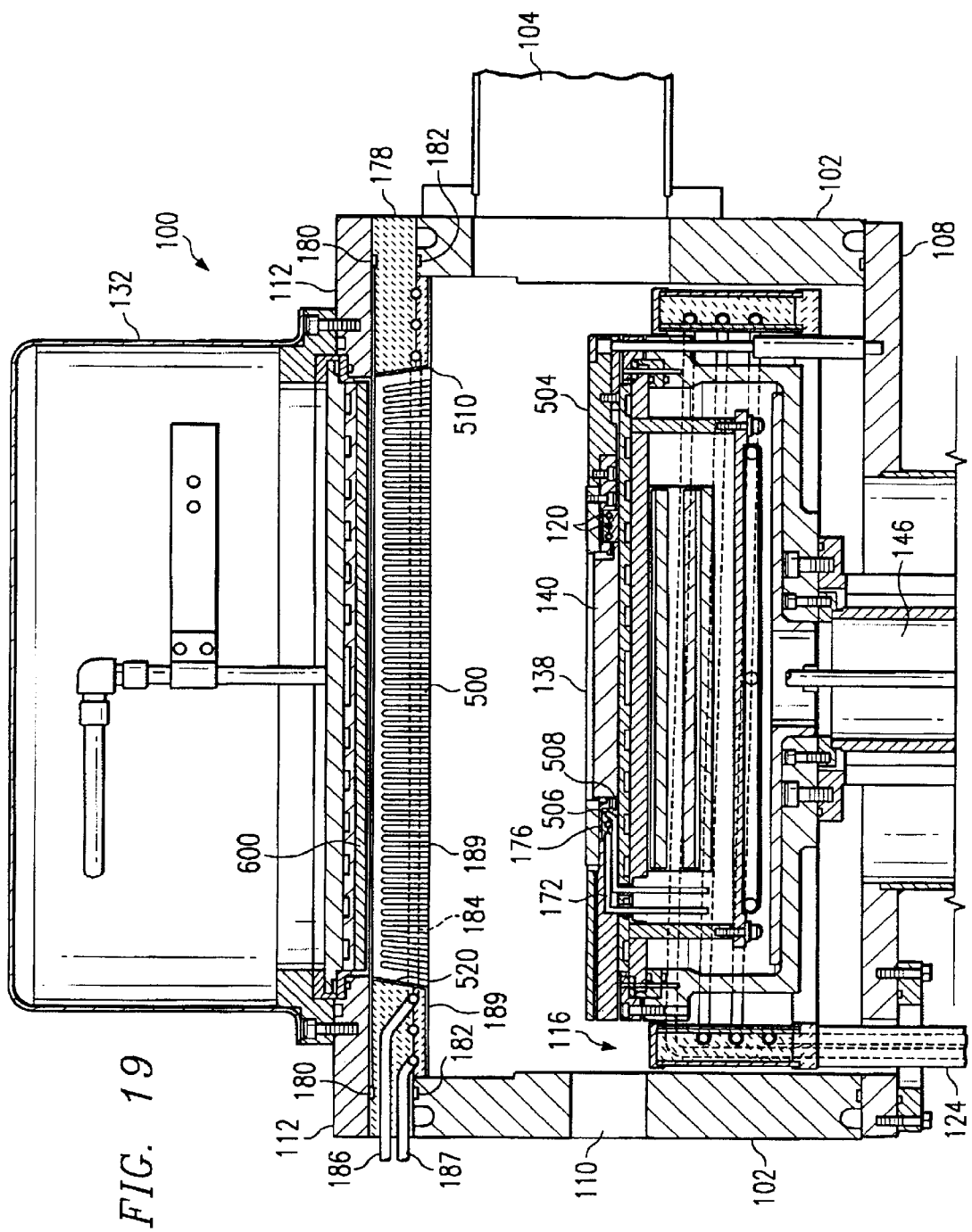
FIGS. 19 and 20 show a side cut-away view of an ICP PVD fabrication process chamber with the first and third embodiments of this invention.

FIG. 19 shows a complete side cut-away view of process chamber 100, including the first and third embodiments of the present invention. FIG. 19 shows the first embodiment of this invention exactly as shown in FIGS. 4 and 6 and its description is the same as before, except that FIG. 19 shows the first embodiment of this invention in the down (wafer-handling) position and shows adjustable-height chuck 140 as a cold chuck. FIG. 19 also shows the third embodiment of this invention exactly as shown in FIG. 17 and the description of that embodiment is the same.

Figure 20:
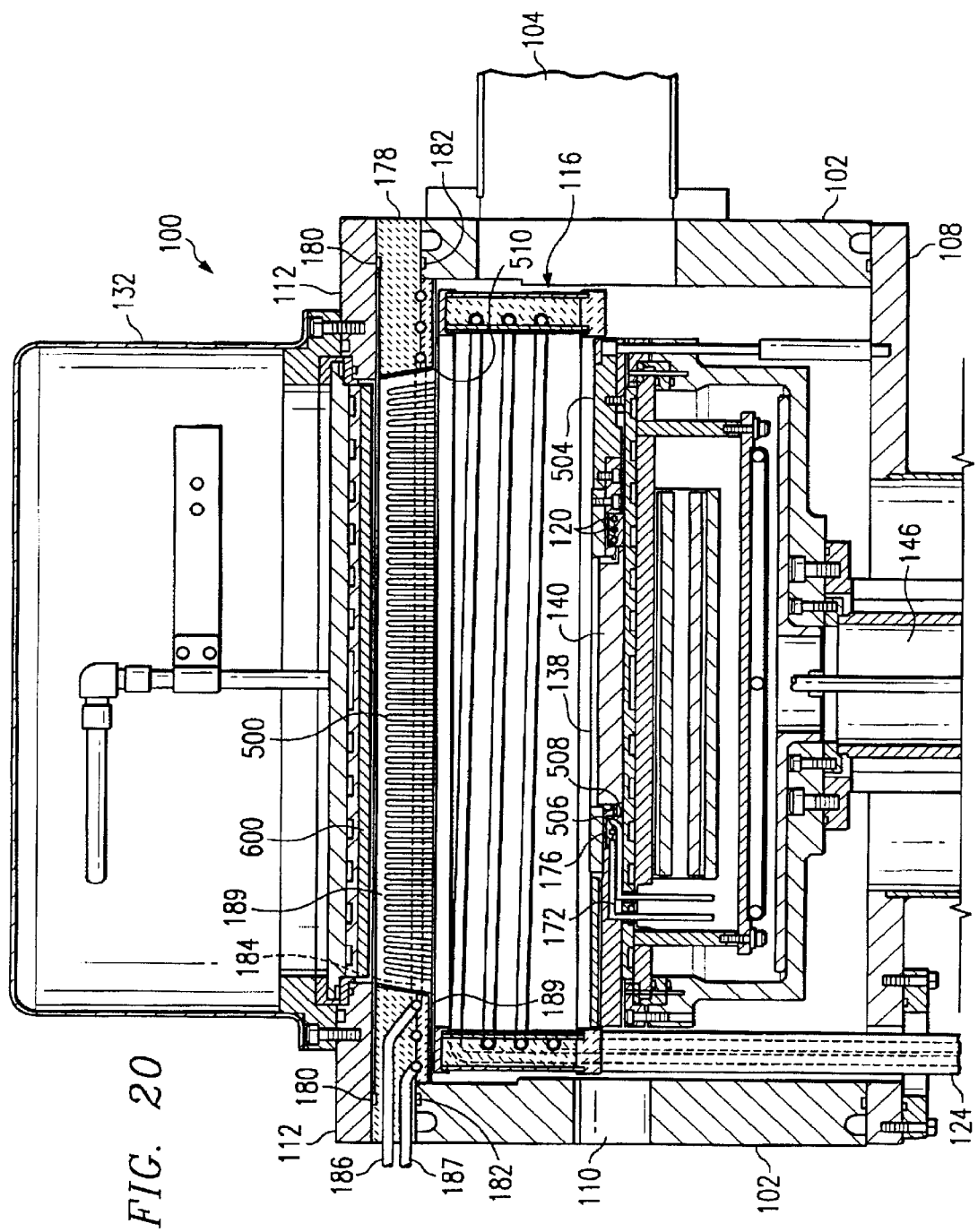

The description of FIG. 20 is essentially the same as for FIG. 19, with the exception that the first embodiment of this invention is shown in its up-most position. Like FIGS. 6 and 7, FIGS. 19 and 20 together show the range of motion of VHIC ionization coil segment 116 of the first embodiment. FIG. 20 further demonstrates the compatibility and complementary nature of the different embodiments of this invention. All embodiments of this invention are compatible and complementary with each other over a wide range of process conditions and target 600-to-substrate 138 spacing to maintain process uniformity (i.e., they can maintain process uniformity regardless of the spacing between target 600 and substrate 138). The present invention can be operated as multi-zone inductively-coupled antennas with each zone being one of the embodiments. When various embodiments of this invention are used together in the same process, it is possible to vary the ratio of power to any of the embodiments and thereby maintain the best uniformity and most ionization. The present invention thus results in levels of control of process uniformity, collimation and ionization that were not previously possible.

Figure 21A:
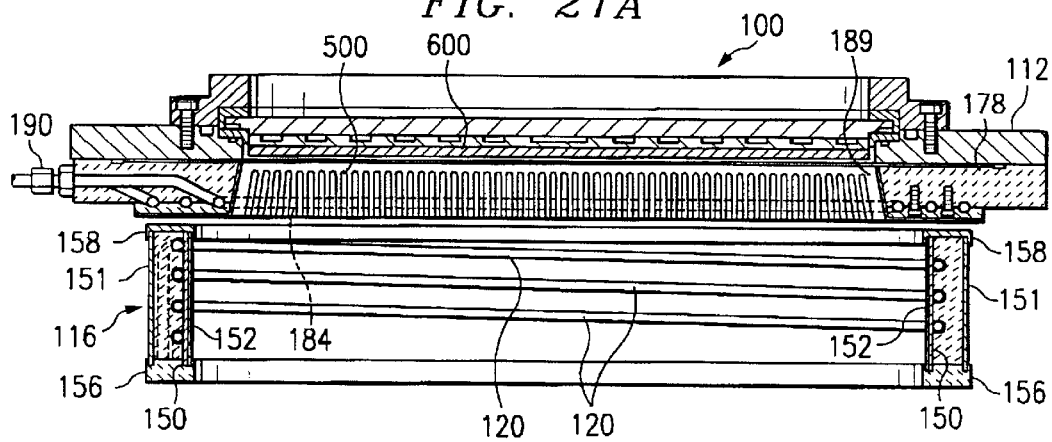
FIGS. 21A and 21B show a side cut-away view and a view looking up of the third embodiment of this invention as well as the first embodiment of this invention.
Figure 21B:
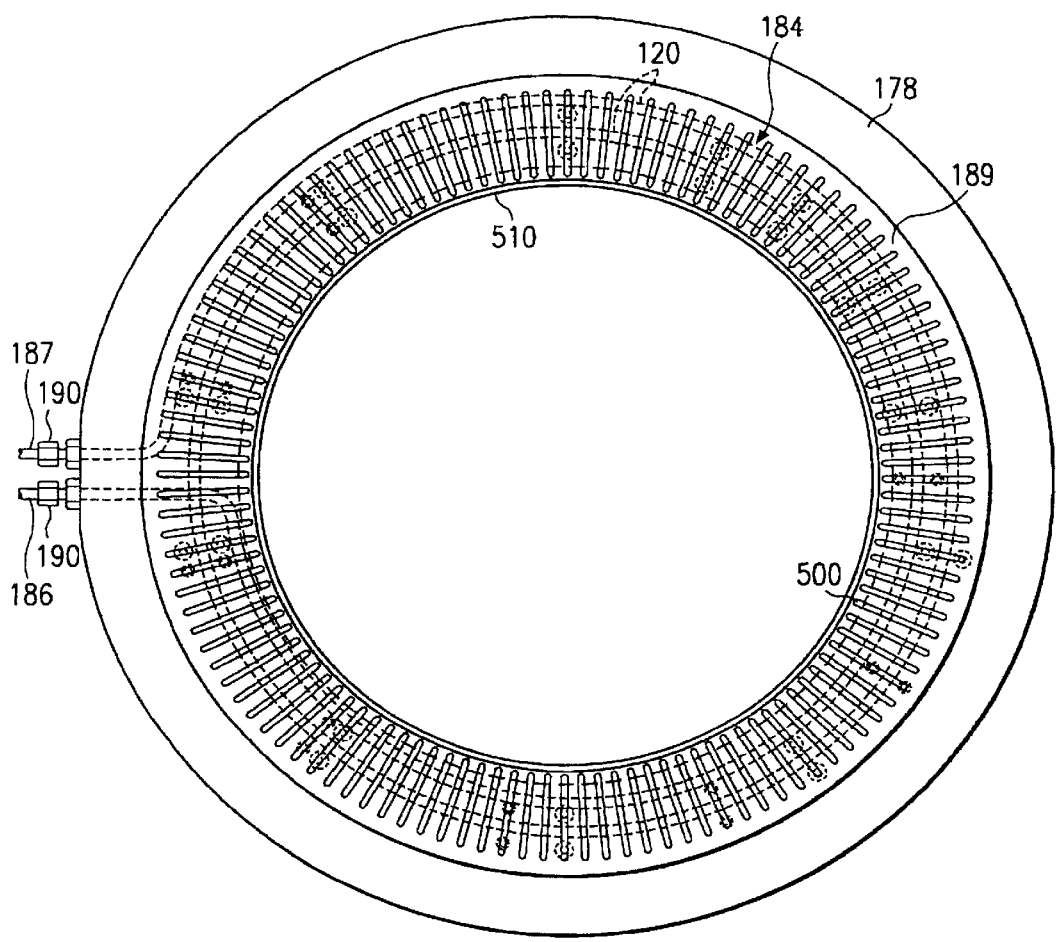

FIGS. 21A and 21B show an isolated side cut-away view of the top portion of process chamber 100 which includes the first and third embodiments of the present invention. FIG. 21B shows a view looking upward to the third embodiment of this invention, which is shown with inductive antenna tubing 184 in a two-coil loop 120 spiral, planar configuration. Vacuum feed tubes 190 are connected to dielectric lid lift insert 178 to provide a connection pathway for RF connection/cooling inlet 186 and RF connection/cooling outlet 187. VHIC ionization coil segment 116 of the first embodiment of this invention is in the up-most position.

Inductive antenna tubing 184 is shown in FIG. 21B as a spiral, planar antenna. A spiral does not have exact cylindrical symmetry. However, FIG. 21B is just one example of the shape that inductive antenna tubing 184 can take. If inductive antenna tubing 184 is in a spiral pattern, it will have a slight impact in the variation in cylindrical symmetry of the ionizing field. However, this should not have an impact on substrate 138 since the substrate 138 diameter is much smaller relative to the inductive antenna tubing 184 diameter. If the fabrication process calls for full symmetry, then inductive antenna tubing 184 can be configured in a circular shape as shown in FIGS. 22A and 22B.

Figure 22A:
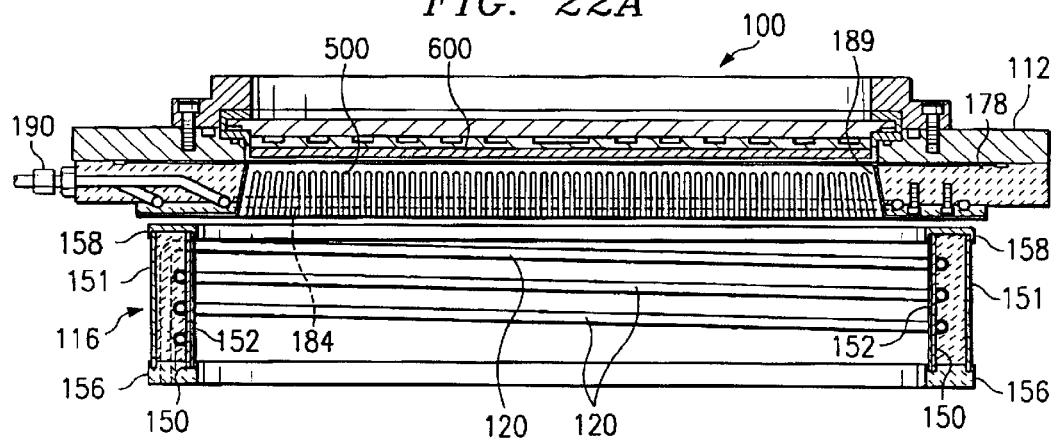
FIGS. 22A and 22B show a side cut-away view and a view looking up of a variation of the third embodiment of this invention consisting of a circular two-loop planar antenna.
Figure 22B:
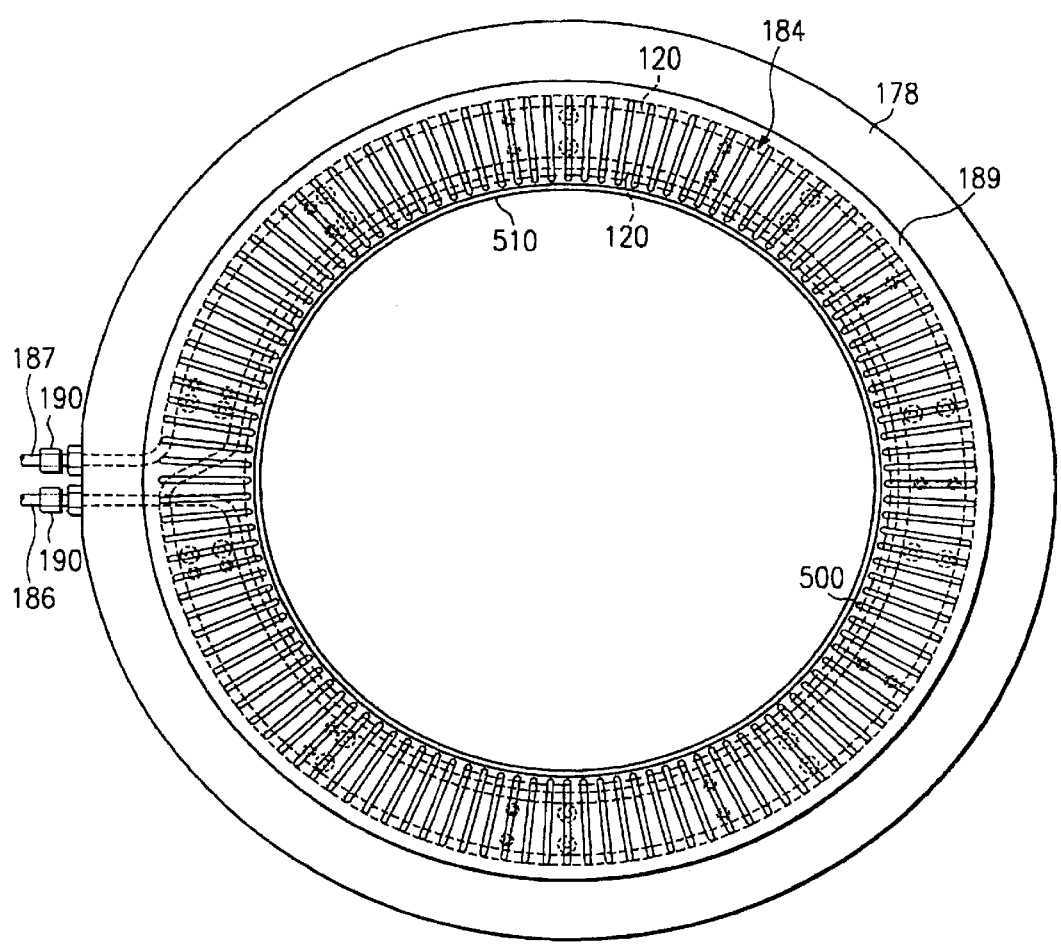
Figure 23A:
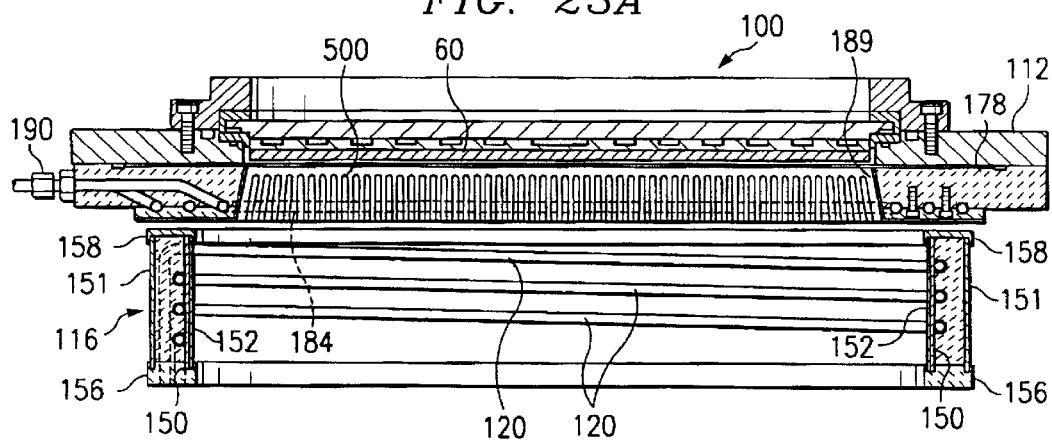
FIGS. 23A and 23B show a side cut-away view and a view looking up of a variation of the third embodiment of this invention consisting of a circular three-loop planar antenna.
Figure 23B:
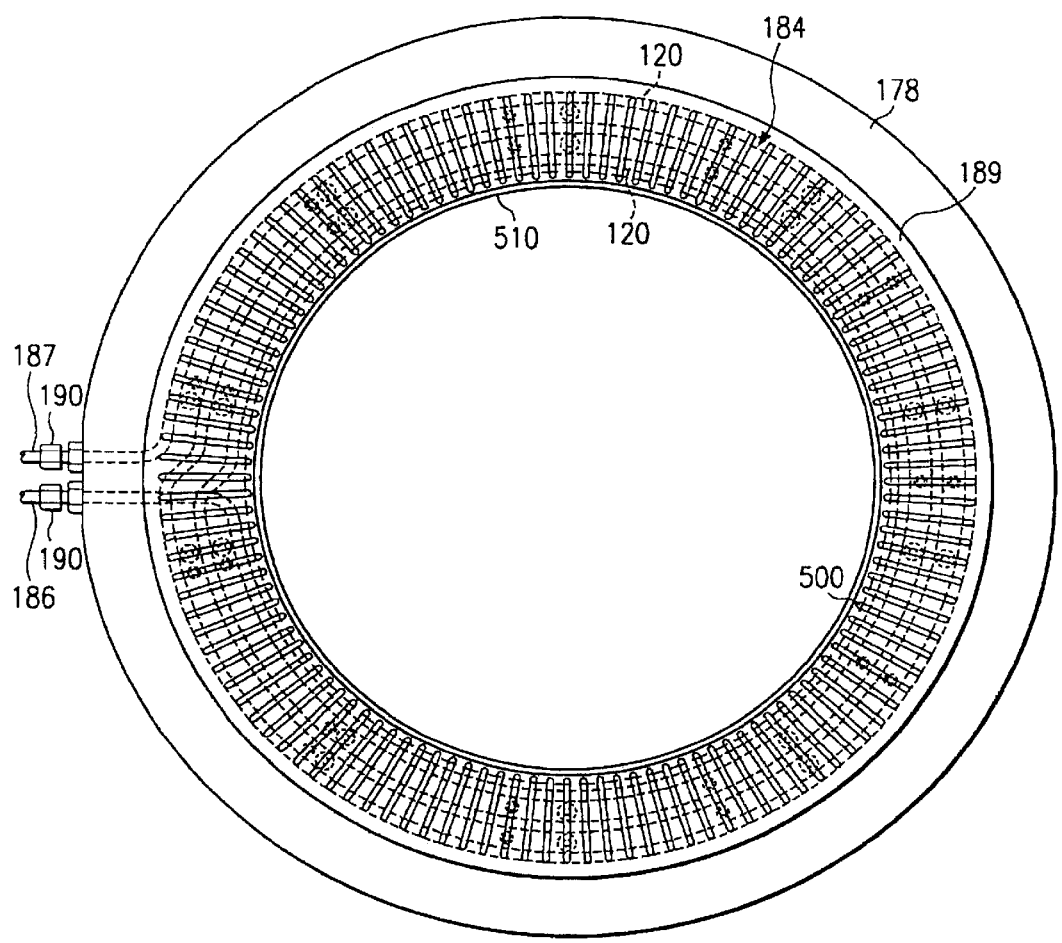

FIGS. 22A and 22B show side cut-away and upward looking views of a variation of the third embodiment of the improved ICP PVD apparatus of the present invention wherein inductive antenna tubing 184 comprises a circular two-coil loop 120 planar antenna. Inductive antenna tubing 184 is shown configured as two circular coil loops 120 centered around the same axis, with one coil loop 120 positioned within a second coil loop 120 of greater diameter. Such a circular configuration results in full cylindrical symmetry, yielding greater uniformity of the ionization field surrounding cathode/target assembly 134. FIGS. 23A and 23B show inductive antenna tubing 184 forming a circular three-coil loop 120 planar antenna. The description of FIGS. 23A and 23B are otherwise identical to those of FIGS. 22A and 22B. A circular configuration is more axis-symmetrical than a spiral configuration and therefore a circular inductive antenna tubing 184 can provide axis-symmetrical uniformity through a larger area or larger diameter of substrate 138 than can a spiral inductive antenna tubing 184.

Figure 24A:
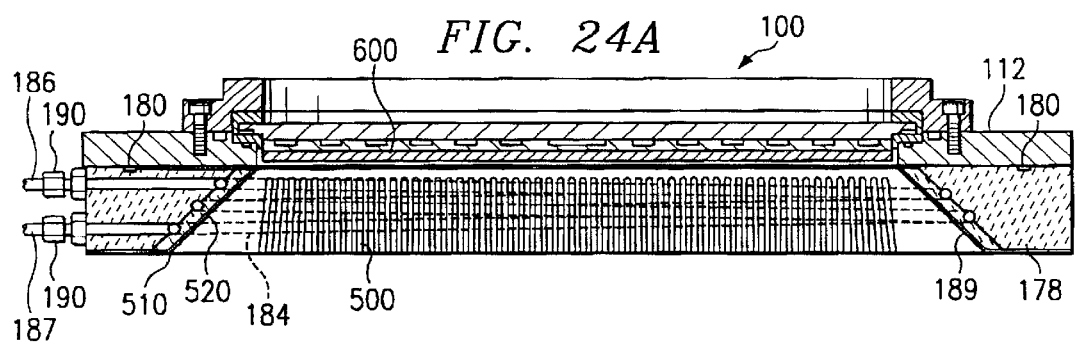
FIGS. 24A and 24B show a side cut-away view and a view looking up of another variation of the third embodiment of this invention consisting of a graded-shape antenna.
Figure 24B:
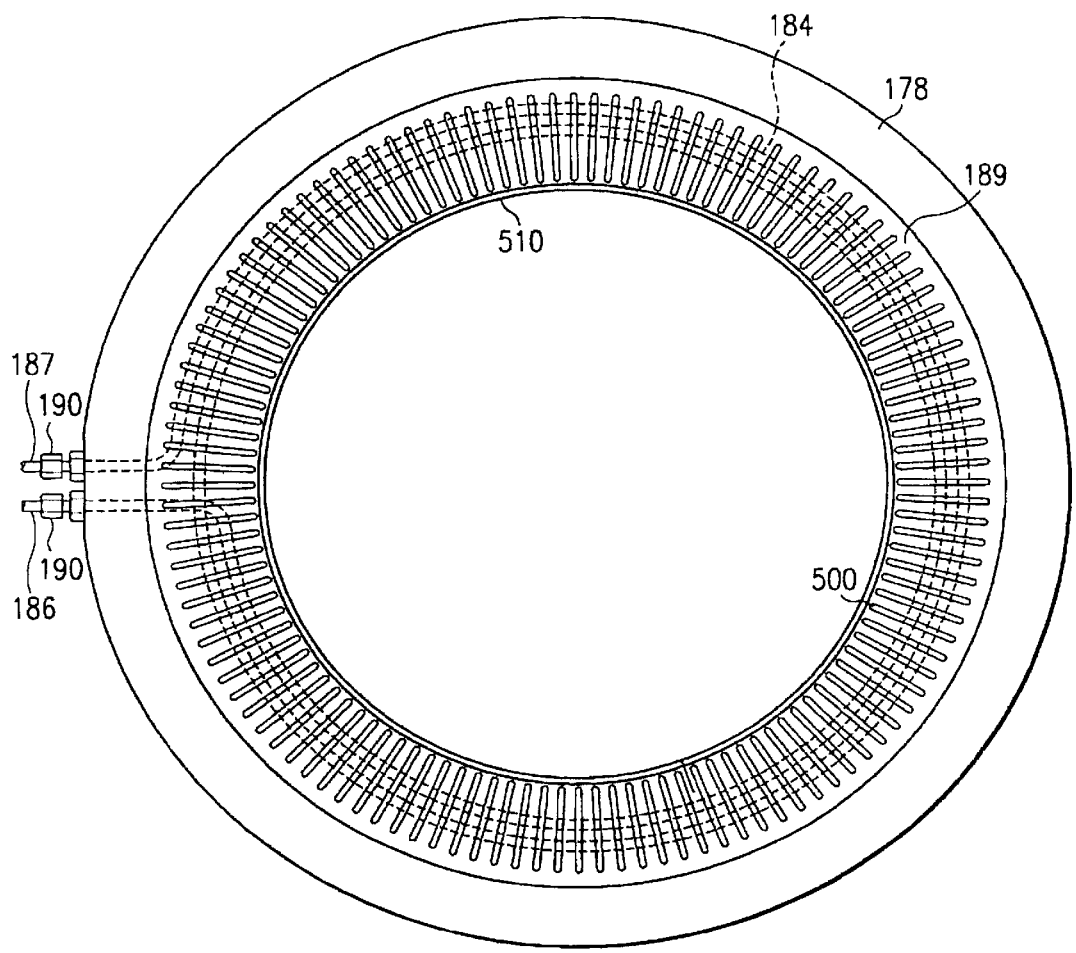

FIGS. 24A and 24B show yet another variation of the third embodiment of this invention. Inductive antenna tubing 184 of the third embodiment of this invention is shown as a graded-shape (conic or spiral) antenna. Inductive antenna tubing 184 is configured with two coil loops 120 at different heights. Dielectric lid lift insert 178 is configured accordingly to provide the increased height necessary for this configuration of inductive antenna tubing 184. Electrostatic shield 189 is essentially the same configuration and same description as in previous figures. A technical advantage of this multi-height graded configuration of inductive antenna tubing 184 is that it extends the magnetic field further into the bulk region of process chamber 100. The two-coil loop 120 spiral configuration of inductive antenna tubing 184 of FIGS. 24A and 24B forms a conic shape that allows extension of the magnetic field further into the bulk region of the process. This conic variation of the third embodiment of this invention serves as both an insert and a bulk antenna near the surface of target 600.

Additional embodiments of the improved ICP PVD apparatus of this invention are possible by combination of any two or all three of the described embodiments. For instance, it is possible to combine the third embodiment with the second embodiment to establish an alternative multi-zone ionization capability. In such a combination, the third embodiment enhances the ionization of the sputtered species near target 600 while the second embodiment maintains a high degree of ionization (and compensates for the ionization losses from the target 600 region toward the substrate 138 region) near substrate 138. Moreover, the relative amounts of RF power delivered to each embodiment of the present invention can be adjusted in order to optimize the ICP PVD process and collimation uniformity at substrate 138. Similarly, the first embodiment of this invention can be combined with one or both of the second and third embodiments to establish an enhanced capability for increased ionization density and collimation process uniformity optimization.

RF power supply 126 frequency can be between one megahertz and 30 megahertz. However, it is preferred to have lower RF power supply 126 frequencies in the range of two to four megahertz so that induced RF voltages from VHIC ionization coil segment 116, antenna coil 172 and inductive antenna tubing 184 are less. For instance, either a 2 MHz or a 13.56 MHz RF power supply (or power supplies) 126 can be used. It is also possible to utilize a pulsed RF power supply (or power supplies) 126 with or without a pulsed or AC substrate 138 bias power supply and pulsed DC ICP PVD magnetron energy source. The relative duty cycles and phases of the pulsed RF and target 600 energy source and/or substrate 138 bias can be adjusted in order to establish the optimal process performance.

In operation, the embodiments of this invention can be effectively utilized to provide high degrees of ICP PVD bottom and step coverage in high-aspect-ratio trench and via structures (such as those shown in FIGS. 2 and 3). By controlling the amounts of RF power to the ICP PVD antenna (i.e, to VHIC ionization coil segment 116 of the first embodiment, antenna coil 172 of the second embodiment or inductive antenna tubing 184 of the third embodiment), and/or the bias power to substrate 138, the degree of ICP PVD collimation can be precisely controlled. For instance, for a given RF power, the degree of ICP PVD collimation can be adjusted and controlled by varying the amount of bias power (or the resulting induced DC voltage) on substrate 138. For a given ICP PVD antenna RF power level, a higher degree of trench and via bottom coverage is achieved due to enhanced ICP PVD collimation. Similarly, for a given level of substrate 138 bias (RF or DC) power (or voltage), a higher amount of ICP PVD antenna RF power results in a higher degree of bottom coverage in high-aspect-ratio trenches and vias.

If desired, the various embodiments of the improved ICP PVD apparatus of this invention can be combined with the long-throw collimation approach to achieve even larger degrees of ICP PVD collimation and bottom coverage. The various embodiments of this invention, however, can be used in a wide range of substrate-to-target spacings (larger spacings with long-throw collimation to smaller spacings without any long-throw collimation contribution).

The embodiments of the improved ICP PVD apparatus of this invention can be used for programmable Electrical Collimation (PEC) to provide excellent conformity, including good sidewall step coverage and bottom coverage in trenches and vias. This can be done by using a multi-step recipe or a modulation-based recipe. For instance, a multi-step ICP PVD process using one of the embodiments of the improved ICP PVD apparatus of this invention may use an initial (first) deposition step with a higher level of RF (or DC) power applied to substrate 138 from a substrate bias power supply through variable-height chuck 140 than in subsequent steps. This will provide a very high degree of collimation per deposition step with reduced degree of deposition collimation (by lowering the amount of RF power to the ICP PVD antenna and/or lowering the amount of RF or DC bias power applied to substrate 138 through variable-height chuck 140).

Similarly a multi-step ICP PVD process using one of the embodiments of the improved ICP PVD apparatus of this invention may consist of an initial high-collimation step (with high ICP PVD antenna RF power and/or substrate 138 bias power) followed by a sequence of successively reduced collimation deposition steps by successively applying smaller amounts of RF power to the ICP PVD antenna and/or RF (or DC) bias power to substrate 138. Another processing method using one of the embodiments of this invention employs ramping down the ICP PVD antenna RF power and/or substrate 138 bias power (DC or RF) from an initial highest level to a final lowest level, either continuously or in a step-wise manner. This methodology would enable continuous coverage of high-aspect-ratio trenches and vias with a relatively high degree of bottom coverage and sidewall step coverage conformality, by first effectively coating the bottoms of trenches and holes and then, gradually coating the sidewalls of the features from the bottom towards the top of the features.

An important advantage of the embodiments and methods of this invention is the capability for real-time adjustment and control of the degree of deposition collimation over a wide range of values (from non-collimated deposition to extreme collimation). This can be accomplished by varying the RF power to the ICP PVD antenna (which controls the degree of ionization) and/or the RF (or DC or pulsed DC/AC) power applied to the variable height chuck 140 for substrate 138 bias (which controls the ion energy/flux). It can further be accomplished by adjusting, in real-time, ICP PVD antenna position relative to the target and substrate.

Therefore, the present invention provides an important technical advantage of an ICP PVD collimation technique that has the capability for real-time adjustment of ICP PVD antenna position relative to the target and substrate.

Another technical advantage of the present invention is that it provides an improved ICP PVD collimation technology that does not consume the ICP PVD antenna and therefore does not require frequent replacement of the ICP PVD antenna or require that the ICP PVD antenna be made of the same material as the target. A still further technical advantage of the present invention is the capability of using a multi-zone ICP PVD antenna to allow for real-time individualized control of the ionization and collimation in distinct areas of the process environment.

Although the present invention has been described in detail herein with reference to the illustrative embodiments, it should be understood that the description is by way of example only and is not to be construed in a limiting sense. It is to be further understood, therefore, that numerous changes in the details of the embodiments of the invention and additional embodiments of the invention will be apparent to, and may be made by, persons of ordinary skill in the art having reference to this description. It is contemplated that all such changes and additional embodiments are within the spirit and true scope of the invention as claimed below.

What is claimed is:

1. An inductvely-coupled plasma ionized physical-vapor deposition system for depositing a material onto a substrate, comprising:
   a vacuum process chamber comprising a main chamber wall and a lid;
   a target assembly comprising a sputtering energy source and a target material exposed to a plasma process environment within said vacuum process chamber;
   a process medium for generating a plasma within said plasma process environment of said vacuum process chamber;
   an adjustable-height inductively-coupled ionization coil segment contained within said plasma process environment for providing ionization and collimabon of a sputtered species from said target material;
   an antenna actuator for controlling a position of said adjustable-height inductively-coupled ionization coil segment relative to said target material within said vacuum process chamber for controlling process uniformity at said substrate during a deposition process;
   a chuck assembly contained in said vacuum process chamber for supporting the substrate; and
   a clamp table operable in conjunction with said chuck assembly and wherein a dielectric housing containing an antenna coil is integrated into said clamp table and surrounds the substrate for providing additional ionization and collimation uniformity optimization of said sputtered species during said deposition process.

2. The system of claim 1, wherein said adjustable-height inductively-coupled ionization coil segment is arranged peripherally and surrounds said process medium within said vacuum process chamber.

3. The system of claim 1, wherein said adjustable-height inductively-coupled ionization coil segment comprises a single continuous segment formed into at least one loop and forming a single-zone inductive-coupling physical-vapor deposition antenna powered by a radio-frequency power supply.

4. The system of claim 1, wherein said adjustable-height inductively-coupled ionization coil segment is further comprised of a plurality of individual loop-shaped segments.

5. The system of claim 4, wherein said plurality of individual loop-shaped segments electrically interconnect to form a continuous single-zone inductive-coupling physical-vapor deposition antenna powered by a radio-frequency power supply.

6. The system of claim 4, wherein said plurality of individual loop-shaped segments electrically interconnect to form a multi-zone inductive-coupling physical-vapor deposition antenna, wherein each zone in said multi-zone inductive-coupling physical-vapor deposition antenna is further comprised of at least one of said plurality of individual loop-shaped segments.

7. The system of claim 6, wherein at least one radio-frequency power supply powers said each zone in said multi-zone inductive-coupling physical-vapor deposition antenna.

8. The system of claim 7, wherein said at least one radio-frequency power supply is electrically connected to and powers said each zone in said multi-zone inductive-coupling physical-vapor deposition antenna through at least one adjustable electrical component for providing multiple inductive zone operation during said deposition process.

9. The system of claim 1, further comprising a chuck assembly contained in said vacuum process chamber for supporting the substrate.

10. The system of claim 9, wherein said chuck assembly is an adjustable-height chuck assembly and further comprising a chuck actuator connected to said chuck assembly for controlling a position of said chuck assembly relative to said target material.

11. The system of claim 9, wherein a dielectric housing containing an antenna coil is integrated into said chuck assembly and surrounds said substrate for providing additional ionization and collimation uniformity optimization of said sputtered species during said deposition process.

12. The system of claim 1, wherein said adjustable-height inductively-coupled ionization coil segment is contained within a dielectric liner.

13. The system of claim 12, wherein said dielectric liner is covered by an electrostatic shield having a multiplicity of slots.

14. The system of claim 13, wherein said electrostatic shield is grounded.

15. The system of claim 13, wherein said electrostatic shield further comprises a multiplicity of angled fins covering said multiplicity of slots for preventing the sputtering of said sputtered species onto the surface of said dielectric housing that is exposed to said plasma process environment through said slots.

16. The system of claim 1, wherein a wafer transport system and said antenna actuator are jointly operable for facilitating automated loading and unloading of a multiplicity of wafers.

17. The system of claim 1, wherein said adjustable-height inductively-coupled ionization coil segment is arranged in a substantially cylindrical manner or in a substantially conic shaped manner.

18. An inductvely-coupled plasma ionized physical-vapor deposition system for depositing a material onto a substrate, comprising:
   a vacuum process chamber comprising a main chamber wall and a lid;
   a target assembly comprising a sputtering energy source and a target material exposed to a plasma process environment within said vacuum process chamber,
   a process medium for generating a plasma within said plasma process environment of said vacuum process chamber;
   an adjustable-height inductively-coupled ionization coil segment contained within said plasma process environment for providing ionization and collimation of a sputtered species from said target material;
   an antenna actuator for controlling a position of said adjustable-height inductively-coupled ionization coil segment relative to said target material within said vacuum process chamber for controlling process uniformity at said substrate during a deposition process; and
   a dielectric lid-lift insert surrounding an inductive antenna tubing is placed between said lid and said main chamber wall of said vacuum process chamber for providing enhanced ionization of said sputtered species during said deposition process.

19. The system of claim 18, wherein said adjustable-height inductively-coupled ionization coil segment is arranged peripherally and surrounds said process medium within said vacuum process chamber.

20. The system of claim 18, wherein said adjustable-height inductively-coupled ionization coil segment comprises a single continuous segment formed into at least one loop and forming a single-zone inductive-coupling physical-vapor deposition antenna powered by a radio-frequency power supply.

21. The system of claim 18, wherein said adjustable-height inductively-coupled ionization coil segment is further comprised of a plurality of individual loop-shaped segments.

22. The system of claim 21, wherein said plurality of individual loop-shaped segments electrically interconnect to form a continuous single-zone inductive-coupling physical-vapor deposition antenna powered by a radio-frequency power supply.

23. The system of claim 21, wherein said plurality of individual loop-shaped segments electrically interconnect to form a multi-zone inductive-coupling physical-vapor deposition antenna, wherein each zone in said multi-zone inductive-coupling physical-vapor deposition antenna is further comprised of at least one of said plurality of individual loop-shaped segments.

24. The system of claim 23, wherein at least one radio-frequency power supply powers said each zone in said multi-zone inductive-coupling physical-vapor deposition antenna.

25. The system of claim 24, wherein said at least one radio-frequency power supply is electrically connected to and powers said each zone in said multi-zone inductive-coupling physical-vapor deposition antenna through at least one adjustable electrical component for providing multiple inductive zone operation during said deposition process.

26. The system of claim 18, further comprising a chuck assembly contained in said vacuum process chamber for supporting the substrate.

27. The system of claim 26, wherein said chuck assembly is an adjustable-height chuck assembly and further comprising a chuck actuator connected to said chuck assembly for controlling a position of said chuck assembly relative to said target material.

28. The system of claim 26, wherein a dielectric housing containing an antenna coil is integrated into said chuck assembly and surrounds said substrate for providing additional ionization and collimation uniformity optimization of said sputtered species during said deposition process.

29. The system of claim 26, further comprising a clamp table operable in conjunction with said chuck assembly and wherein a dielectric housing containing an antenna coil is integrated into said clamp table and surrounds the substrate for providing additional ionization and collimation uniformity optimization of said sputtered species during said deposition process.

30. The system of claim 18, wherein said adjustable-height inductively-coupled ionization coil segment is contained within a dielectric liner.

31. The system of claim 30, wherein said dielectric liner is covered by an electrostatic shield having a multiplicity of slots.

32. The system of claim 31, wherein said electrostatic shield is grounded.

33. The system of claim 31, wherein said electrostatic shield further comprises a multiplicity of angled fins covering said multiplicity of slots for preventing the sputtering of said sputtered species onto the surface of said dielectric housing that is exposed to said plasma process environment through said slots.

34. The system of claim 18, wherein a wafer transport system and said antenna actuator are jointly operable for facilitating automated loading and unloading of a multiplicity of wafers.

35. The system of claim 18, wherein said adjustable-height inductively-coupled ionization coil segment is arranged in a substantially cylindrical manner or in a substantially conic shaped manner.

36. An inductvely-coupled plasma ionized physical-vapor deposition system for depositing a material onto a substrate, comprising:
- a vacuum process chamber comprising a main chamber wall and a lid for processing the substrate;
- a target assembly comprising a sputtering energy source and a target material exposed to a plasma process environment within said vacuum process chamber;
- a chuck assembly for supporting said substrate;
- a process medium for generating a plasma within said plasma process environment of said vacuum process chamber; and
- an inductive antenna tubing contained within a dielectric lid-lift insert between said lid and said main chamber wall of said vacuum process chamber for providing ionization and collimation of a sputtered species during a deposition process.

37. The system of claim 36, wherein said inductive antenna tubing is arranged in a substantially planar spiral or a substantially planar circular manner.

38. The system of claim 36, wherein said inductive antenna tubing is arranged in a graded conic manner.

39. The system of claim 36, further comprising a variable height inductively-coupled ionization coil segment contained within said plasma process environment and coupled to an antenna actuator for controlling a position of said variable-height inductively-coupled ionization coil segment relative to said target material for providing enhanced ionization and collimation of said sputtered species from said target material.

40. The system of claim 36, wherein said inductive antenna tubing comprises a single continuous segment formed into at least one loop and forming a single-zone inductive-coupling physical-vapor deposition antenna.

41. The system of claim 36, wherein said inductive antenna tubing is further comprised of a plurality of individual loop-shaped segments.

42. The system of claim 42, wherein said plurality of individual loop-shaped segments electrically interconnect to form a continuous single-zone inductive-coupling physical-vapor deposition antenna.

43. The system of claim 41, wherein said plurality of individual loop-shaped segments electrically interconnect to form a multi-zone inductive-coupling physical-vapor deposition antenna, wherein each zone in said multi-zone inductive-coupling physical-vapor deposition antenna is further comprised of at least one of said plurality of individual loop-shaped segments.

44. The system of claim 43, wherein at least one radio-frequency power supply powers said each zone in said multi-zone inductive-coupling physical-vapor deposition antenna.

45. The system of claim 44, wherein said at least one radio-frequency power supply is electrically connected to and powers said each zone in said multi-zone inductive-coupling physical-vapor deposition antenna through at least one adjustable electrical component for providing multiple inductive zone operation during said deposition process.

46. The system of claim 36, wherein said dielectric lid lift insert is covered by an electrostatic shield having a multiplicity of slots.

47. The system of claim 46, wherein said electrostatic shield is grounded.

48. The system of claim 47, wherein said, electrostatic shield further comprises a multiplicity of angled fins covering said multiplicity of slots for preventing the sputtering of said sputtered species onto the surface of said dielectric housing that is exposed to said plasma process environment through said slots.

49. The system of claim 36, wherein a dielectric housing containing an antenna coil is integrated into said chuck assembly and surrounds said substrate for providing additional ionization and collimation uniformity optimization of said sputtered species during said deposition process.

50. The system of claim 49, further comprising a clamp table operable in conjunction with said chuck assembly and wherein a dielectric housing containing an antenna coil is integrated into said clamp table and surrounds the substrate for providing additional ionization and collimation uniformity optimization of said sputtered species during said deposition process.

51. A method for inductively-coupled plasma ionized physical-vapor deposition of a material layer onto a substrate in a vacuum process chamber having a plasma process environment, comprising:
- supporting said substrate using a chuck assembly;
- placing a dielectric lid-lift insert containing an inductive antenna tubing between a lid and a main chamber wall of said vacuum process chamber; and
- applying radio-frequency power from at least one radio-frequency power supply to said inductive antenna tubing for ionization and collimation of a sputtered species emitted from a target material during a deposition process.

52. The method of claim 51, wherein said inductive antenna tubing is arranged peripherally and surrounds said target material.

53. The method of claim 51, further comprising:
- coupling an adjustable-height inductively-coupled ionization coil segment contained within said plasma process environment to an antenna actuator; and
- controlling a position of said adjustable-height inductively-coupled ionization coil segment relative to said target material using said antenna actuator for providing enhanced ionization and collimation of a sputtered species from said target material.

54. The method of claim 53, further comprising:
- operating a clamp table in conjunction with said chuck assembly for holding said substrate; and
- integrating a dielectric housing containing an antenna coil into said clamp table wherein said antenna coil is placed peripherally with respect to said substrate and surrounds said substrate for providing additional ionization and collimation uniformity optimization of said sputtered species during said deposition process.

55. The method of claim 53, further comprising integrating a dielectric housing containing an antenna coil into a clamp table wherein said antenna coil is placed peripherally with respect to said substrate and surrounds said substrate for providing additional ionization and collimation uniformity optimization of said sputtered species during said deposition process.

56. The method of claim 53, wherein said inductive antenna tubing is further comprised of a plurality of individual loop-shaped segments.

57. The method of claim 56, further comprising electrically interconnecting said plurality of individual loop-shaped segments to form a multi-zone inductive-coupling physical-vapor deposition antenna, wherein each zone in said multi-zone inductive-coupling physical-vapor deposition antenna is further comprised of at least one of said plurality of individual loop-shaped segments.

58. The method of claim 57, wherein at least one of said at least one radio-frequency power supplies powers said each zone in said multi-zone inductive-coupling physical-vapor deposition antenna.

59. The method of claim 57, further comprising varying said radio-frequency power applied to each of said each zones in said multi-zone inductive-coupling physical-vapor deposition antenna independently of each of other ones of said each zones in said multi-zone inductive-coupling physical-vapor deposition antenna for providing additional ionization and collimation uniformity optimization of said sputtered species during said deposition process.

60. The method of claim 53, further comprising the steps of:

initially setting the amount of said radio-frequency power applied to said inductive antenna tubing at a higher level at the beginning of said deposition process; and successively reducing the amount of said radio-frequency power throughout said deposition process duration to enhance an overall bottom coverage, step coverage, and conformality of the deposition process on said substrate, wherein said substrate comprises high-aspect-ratio surface features.

61. The method of claim 60, wherein said successively reducing step further comprises the step of continuously reducing said radio-frequency power to form a power ramp-down profile in time between a higher level at the beginning of said deposition process and a lower level at the end of said deposition process.

62. The method of claim 60, wherein said successively reducing step further comprises the step of reducing said radio-frequency power in a step-wise manner to form a step-wise reduced power ramp-down profile in time between a higher level at the beginning of said deposition process and a lower level at the end of said deposition process.

63. The method of claim 53, further steps of:

supplying electrical bias power to said chuck assembly;

setting the amount of said electrical bias power applied to said chuck assembly at the beginning of said deposition process to an initial value; and successively reducing the amount of said electrical bias power throughout said deposition process duration to enhance an overall bottom coverage, step coverage, and conformality of the deposition process on said substrate, wherein said substrate comprises high-aspect-ratio surface features.

64. The method of claim 63, wherein said successively reducing step further comprises the step of continuously reducing said radio-frequency power to form a continuously reduced power ramp-down profile in time between a higher level at the beginning of said deposition process and a lower level at the end of said deposition process.

65. The method of claim 63, wherein said successively reducing step further comprises reducing said radio-frequency power in a step-wise fashion to form step-wise reduced power ramp-down profile in time between a higher level at the beginning of said deposition process and a lower level at the end of said deposition process.

* * * * *